(12) United States Patent
Bowman et al.

(10) Patent No.: US 11,145,537 B2
(45) Date of Patent: Oct. 12, 2021

(54) SILICON-ON-INSULATOR SUBSTRATE INCLUDING TRAP-RICH LAYER AND METHODS FOR MAKING THEREOF

(71) Applicant: Addison Crockett, Tempe, AZ (US)

(72) Inventors: Ron Bowman, Chandler, AZ (US); Mark Franklin, Scottsdale, AZ (US)

(73) Assignee: Addison Crockett, Tempe, AZ (US)

( * ) Notice: Subject to any disclaimer, the term of this patent is extended or adjusted under 35 U.S.C. 154(b) by 0 days.

(21) Appl. No.: 17/065,311

(22) Filed: Oct. 7, 2020

(65) Prior Publication Data

US 2021/0104430 A1 Apr. 8, 2021

Related U.S. Application Data

(60) Provisional application No. 62/911,827, filed on Oct. 7, 2019, provisional application No. 62/911,835, filed on Oct. 7, 2019, provisional application No. 62/911,843, filed on Oct. 7, 2019.

(51) Int. Cl.
*H01L 21/762* (2006.01)
*H01L 27/12* (2006.01)
*H01L 21/02* (2006.01)

(52) U.S. Cl.
CPC .. *H01L 21/76254* (2013.01); *H01L 21/02164* (2013.01); *H01L 21/02274* (2013.01); *H01L 27/1203* (2013.01)

(58) Field of Classification Search
None
See application file for complete search history.

(56) References Cited

U.S. PATENT DOCUMENTS

| 3,798,081 | A | 3/1974 | Beyer | |
|---|---|---|---|---|
| 6,127,285 | A | 10/2000 | Nag | |
| 2016/0372484 | A1 | 12/2016 | Nguyen et al. | |
| 2018/0233401 | A1* | 8/2018 | Shank | H01L 27/1203 |
| 2019/0273028 | A1 | 9/2019 | Jain et al. | |
| 2020/0126846 | A1* | 4/2020 | Peidous | H01L 21/84 |
| 2020/0176252 | A1* | 6/2020 | Englekirk | H01L 27/1203 |

OTHER PUBLICATIONS

International Search Report and Written Opinion from International Application No. PCT/US2020/054588 dated Jan. 22, 2021.

* cited by examiner

*Primary Examiner* — Asok K Sarkar
(74) *Attorney, Agent, or Firm* — Greenberg Traurig, LLP

(57) ABSTRACT

A silicon-on-insulator substrate includes: (1) a high-resistivity base layer including silicon and a trap-rich region including arsenic diffused within a first side of the high-resistivity base layer, wherein the trap-rich region has a thickness that is in a range of 1 to 10 microns and a trap density that is in a range of $0.8*10^{10}$ $cm^2$ $eV^{-1}$ to $1.2*10^{10}$ $cm^2$ $eV^{-1}$, wherein the high-resistivity base layer has resistivity in a range of 50 to 100 ohm-meters and a thickness in a range of 500 to 700 microns; (2) a silicon dioxide layer positioned on the first side of the high-resistivity base layer and having a thickness that is in a range of 1000 to 5000 angstroms; and (3) a transfer layer positioned on the silicon dioxide layer, wherein the transfer layer comprises a silicon wafer having a thickness that is a range of 500 to 5000 angstroms.

7 Claims, 12 Drawing Sheets

SILICON-ON-INSULATOR SUBSTRATE INCLUDING TRAP-RICH LAYER AND METHODS FOR MAKING THEREOF

CROSS-REFERENCE TO RELATED APPLICATIONS

This application is a Section 111(a) application relating to and claiming the benefit of commonly-owned, U.S. Provisional Patent Application No. 62/911,827, filed Oct. 7, 2019, entitled "SILICON-ON-INSULATOR SUBSTRATE INCLUDING TRAP-RICH LAYER AND METHODS FOR MAKING THEREOF"; U.S. Provisional Patent Application No. 62/911,835, filed Oct. 7, 2019, entitled "SILICON-ON-INSULATOR SUBSTRATE INCLUDING TRAP-RICH LAYER AND METHODS FOR MAKING THEREOF"; and U.S. Provisional Patent Application No. 62/911,843, filed Oct. 7, 2019, entitled "SILICON-ON-INSULATOR SUBSTRATE INCLUDING TRAP-RICH LAYER AND METHODS FOR MAKING THEREOF", the contents of all of which are incorporated herein by reference in their entirety.

FIELD OF THE INVENTION

The field of invention relates to silicon-on-insulator substrates and methods for making such substrates. In particular, the field of invention relates silicon-on-insulator substrates having trap-rich layers and methods for making such substrates.

BACKGROUND OF THE INVENTION

Integrated chips are formed on substrates comprising a semiconductor material. Traditionally, integrated chips were formed on bulk substrates comprising a solid layer of semi-conductor material. In more recent years, silicon-on-insulator substrates have emerged as an alternative. Silicon-on-insulator ("SOI") substrates are substrates that have a thin layer of active silicon separated from an underlying handle wafer by a layer of insulating material. The layer of insulating material electrically isolates the thin layer of active silicon from the handle wafer, thereby reducing current leakage of devices formed within the thin layer of active silicon. The thin layer of active silicon also provides for other advantages, such as faster switching times and lower operating voltages, which have made SOI substrates widely used for high volume fabrication of radio frequency ("RF") systems, such as RF switches.

SOI substrates typically use handle wafers having a high resistivity. The use of high resistivity handle wafers allows for the SOI substrates to meet application requirements, such as device-to-device isolation, passive component Q-factors, etc. However, the doping in such high resistivity handle wafers is low, such that carriers from a handle wafer surface and sub-surface region may build up along a surface of a high resistivity handle wafer to form an accumulation layer or an inversion layer, depending on the type of charges present in an overlying buried oxide layer. Voltages applied to devices within an overlying thin layer of active silicon can interact with such an accumulation layer, resulting in parasitic surface conduction that introduces undesirable device cross-talk and/or non-linear distortion into RF signals.

BRIEF DESCRIPTION OF THE FIGURES

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

FIG. 6C shows an intermediate product at a third stage of the exemplary method of FIG. 5.

SUMMARY OF THE INVENTION

Figure 1:
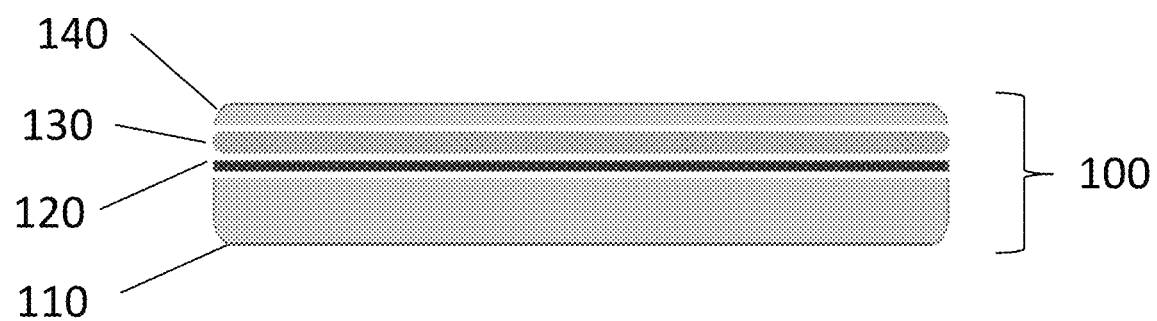
FIG. 1 shows an exemplary silicon-on-insulator substrate that is suitable for applications such as in the fabrication of RF systems.

In some embodiments, a substrate includes a high-resistivity base layer having a first side and a second side; a silicon nitride layer positioned on the first side of the high-resistivity base layer; a silicon dioxide layer positioned on the silicon nitride layer opposite the high-resistivity base layer; and a silicon layer positioned on the silicon dioxide layer opposite the silicon nitride layer.

In some embodiments, a method for making a substrate includes providing a first silicon wafer having a first side and a second side; depositing a silicon nitride layer on the first side of the first silicon wafer; depositing a silicon dioxide layer on the silicon nitride layer opposite the first side of the first silicon wafer; providing a second silicon wafer; introducing a hydrogen implant into the second silicon wafer so as to define a cleave plane; activating the silicon dioxide layer; adhering the second silicon wafer to the activated silicon dioxide layer, thereby producing a combined wafer; annealing the combined wafer; applying a tension to the combined wafer in a direction so as to urge the first silicon wafer and the second silicon wafer apart from one another; and striking an edge of the second silicon wafer so as to cleave the second silicon wafer at the cleave plane, thereby producing a silicon-on-insulator substrate.

In some embodiments, the step of depositing the silicon nitride layer is performed using a high density plasma chemical vapor deposition process. In some embodiments, the step of depositing the silicon dioxide layer is performed using a high density plasma chemical vapor deposition process.

In some embodiments, a substrate includes a high-resistivity base layer having a first side and a second side; an arsenic layer diffused into the first side of the high-resistivity base layer; a silicon dioxide layer positioned on the first side of the high-resistivity base layer overlaying the arsenic layer; and a silicon layer positioned on the silicon dioxide layer opposite the arsenic layer.

In some embodiments, a method for making a substrate includes providing a first silicon wafer having a first side and a second side; diffusing an arsenic layer into the first side of the first silicon wafer; depositing a silicon dioxide layer on the first side of the high-resistivity base layer overlaying the arsenic layer; providing a second silicon wafer; introducing a hydrogen implant into the second silicon wafer so as to define a cleave plane; activating the silicon dioxide layer; adhering the second silicon wafer to the activated silicon dioxide layer, thereby producing a combined wafer; annealing the combined wafer; applying a tension to the combined wafer in a direction so as to urge the first silicon wafer and the second silicon wafer apart from one another; and striking an edge of the second silicon wafer so as to cleave the second silicon wafer at the cleave plane, thereby producing a silicon-on-insulator substrate.

In some embodiments, the step of diffusing the arsenic layer is performed by spinning a solution including arsenic and allowing the arsenic to diffuse for a controlled time period under a controlled temperature. In some embodiments, the step of depositing the silicon dioxide layer is performed using a high density plasma chemical vapor deposition process.

In some embodiments, a silicon-on-insulator substrate includes a layered structure including, in layered order: (1) a high-resistivity base layer having a first side and a second side opposite the first side, wherein the high-resistivity base layer includes (a) silicon, and (b) a trap-rich region including arsenic diffused within the first side of the high-resistivity base layer, wherein the trap-rich region has (i) a thickness that is in a range of 1 to 10 microns, and (ii) a trap density that is in a range of $0.8*10^{10}$ cm$^2$ eV$^{-1}$ to $1.2*10^{10}$ cm$^2$ eV$^{-1}$, wherein the high-resistivity base layer has (a) a resistivity in a range of from 50 to 100 ohm-meters, and (b) a thickness in a range of from 500 to 700 microns; (2) a silicon dioxide layer positioned on the first side of the high-resistivity base layer, wherein the silicon dioxide layer has a thickness that is in a range of from 1000 to 5000 angstroms; and (3) a transfer layer positioned on the silicon dioxide layer, wherein the transfer layer includes a silicon wafer, and wherein the transfer layer has a thickness that is a range of from 500 to 5000 angstroms.

In some embodiments, the trap-rich region has a trap density that is in a range of $10^{10}$ cm$^2$ eV$^{-1}$ to $1.2*10^{10}$ cm$^2$ eV$^{-1}$. In some embodiments, the trap-rich region includes arsenic interspersed within a crystalline structure of the silicon of the high-resistivity base layer. In some embodiments, the trap-rich region has a thickness that is in a range of from 4 microns to 7 microns. In some embodiments, the high-resistivity base layer has a thickness that is in a range of from 550 to 650 microns. In some embodiments, the silicon dioxide layer has a thickness that is in a range of from 2000 to 4000 angstroms. In some embodiments, the transfer layer has a thickness that is in a range of from 2000 to 3500 angstroms.

In some embodiments, a method includes providing a first silicon wafer having a first side and a second side; applying an arsenic solution to the first side of the first silicon wafer, wherein the solution is a liquid colloidal solution; maintaining the first silicon wafer with the arsenic solution on the first side at a controlled temperature for a controlled period of time to result in the arsenic diffused into the first side of the first silicon wafer to produce a trap-rich region, wherein the controlled time period is in a range of from 5 hours to 20 hours, wherein the controlled temperature is in a range of from 700 to 1200 degrees Celsius, wherein a thickness of the trap-rich region is in a range of from 1 to 10 microns, and wherein the trap-rich region has a trap density that is in a range of $0.8*10^{10}$ cm$^2$ eV$^{-1}$ to $1.2*10^{10}$ cm$^2$ eV$^{-1}$; depositing a silicon dioxide layer on the first side of the first silicon wafer using a high density plasma chemical vapor deposition (HDPCVD) process, wherein the HDPCVD process uses an inductively-coupled plasma source, wherein the inductively-coupled plasma source is operated at a power that is in a range of from 65 watts to 225 watts, wherein the HDPCVD process uses a flow of oxygen gas, a flow of silane gas, and a flow of argon gas, wherein a flow rate of the flow of oxygen gas is in a range of from 20 to 35 sccm, wherein a flow rate of the flow of silane gas is in a range of 20 to 35 sccm, wherein a flow rate of the flow of argon gas in a range of from 20 to 35 sccm, wherein the HDPCVD process is performed at a pressure that is in a range of from 5 millitorr to 20 millitorr, wherein the HDPCVD process is performed using a bias power that is in a range of from 0 to 100 watts, wherein the HDPCVD process is performed with the first silicon wafer held at a temperature that is in a range of from 100 to 250 degrees Celsius, wherein a deposition rate of the silicon dioxide layer is in a range of from 900 to 1100 angstroms per minute, and wherein a thickness of the silicon dioxide layer is in a range of from 1500 to 5000 angstroms; providing a second silicon wafer having a first side and a second side opposite the first side of the second silicon wafer; introducing a hydrogen implant into the second silicon wafer so as to define a cleave plane, wherein a thickness of a portion of the second silicon wafer between the first side of the second silicon wafer and the cleave plane is in a range of from 500 to 5000 angstroms; activating the silicon dioxide layer, wherein the activating step includes low-pressure plasma-activated bonding at a pressure in a range of from 0.1 to 100 Pa; contacting the first side of the second silicon wafer to the activated silicon dioxide layer, thereby producing a combined wafer; annealing the combined wafer, wherein the annealing is performed at a temperature in a range of from 200 to 400 degrees Celsius for a duration in a range of from one hour to eight hours; applying a tension to the combined wafer in a direction so as to urge the first silicon wafer and the second silicon wafer apart from one another; and striking an edge of the second silicon wafer so as to cleave the second silicon wafer at the cleave plane, thereby producing a silicon-on-insulator substrate.

In some embodiments, the step of applying the arsenic solution to the first side of the first silicon wafer includes spin-coating the arsenic solution onto the first side of the first silicon wafer. In some embodiments, the liquid colloidal solution includes arsenic-doped glass. In some embodiments, the flow rate of the flow of oxygen gas, the flow rate of the flow of silane gas, and the flow rate of the flow of argon gas are the same as one another. In some embodiments, the flow rate of the flow of oxygen gas, the flow rate of the flow of silane gas, and the flow rate of the flow of argon gas are selected to control a refractive index of the silicon dioxide layer. In some embodiments, the controlled time period is selected to control a charge dissipation of the trap-rich layer. In some embodiments, the trap-rich region has a trap density that is in a range of $10^{10}$ cm$^2$ eV$^{-1}$ to $1.2*10^{10}$ cm$^2$ eV$^{-1}$. In some embodiments, the step of maintaining the first silicon wafer with the arsenic solution on the first side at a controlled temperature for a controlled period of time produces the arsenic interspersed within a crystalline structure of the silicon of the high-resistivity base layer. In some embodiments, the step of maintaining the first silicon wafer with the arsenic solution on the first side at a controlled temperature for a controlled period of time produces the trap-rich region having a thickness that is in a range of from 4 microns to 7 microns. In some embodiments, the high-resistivity base layer has a thickness that is in a range of from 550 to 650 microns. In some embodiments, the silicon dioxide layer has a thickness that is in a range of from 2000 to 4000 angstroms. In some embodiments, the thickness of the portion of the second silicon wafer between the first side of the second silicon wafer and the cleave plane is in a range of from 2000 to 3500 angstroms.

DETAILED DESCRIPTION OF THE INVENTION

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Unless otherwise defined, all terms (including technical and scientific terms used herein have the same meaning as commonly understood by one having ordinary skill in the art to which this invention belongs. It will further be understood that terms, such as those defined, in commonly used dictionaries, should be interpreted as having a meaning that is consistent with their meaning in the context of the relevant art and the present disclosure and will not be interpreted in an idealized or overly formal sense unless expressly defined.

The present disclosure describes an exemplary embodiment of a miniaturized wearable injection device. It will be apparent to those of skill in the art that the general principles embodied in the exemplary device may also be embodied in other devices.

The term "trap-rich layer" or "trap-rich region" as used herein, refers to a layer or region having a high density of electrically-active carrier traps. The incorporation of a trap-rich layer or region into an SOT substrate can significantly decrease the lifetime and mobility of free charge carriers, thereby maintaining the effective resistance of the substrate. In some embodiments, a trap rich layer or region has a trap density of greater than $10^{10}$ cm$^2$ eV$^{-1}$. In some embodiments, a trap rich layer or region has a trap density of from $0.8*10^{10}$ cm$^2$ eV$^{-1}$ to $1.2*10^{10}$ cm$^2$ eV$^{-1}$. In some embodiments, a trap rich layer or region has a trap density of from $0.9*10^{10}$ cm$^2$ eV$^{-1}$ to $1.1*10^{10}$ cm$^2$ eV$^{-1}$. In some embodiments, a trap rich layer or region has a trap density of from $10^{10}$ cm$^2$ eV$^{-1}$ to $1.2*10^{10}$ cm$^2$ eV$^{-1}$. In some embodiments, a trap rich layer or region has a trap density of from $10^{10}$ cm$^2$ eV$^{-1}$ to $1.5*10^{10}$ cm$^2$ eV$^{-1}$. In some embodiments, a trap rich layer or region has a trap density of from $10^{10}$ cm$^2$ eV$^{-1}$ to $2*10^{10}$ cm$^2$ eV$^{-1}$. In some embodiments, a trap rich layer or region has a trap density of from $0.5*10^{10}$ cm$^2$ eV$^{-1}$ to $10^{10}$ cm$^2$ eV$^{-1}$.

FIG. 1 shows a schematic view of a first exemplary device 100. In some embodiments, the device 100 may be termed a silicon-on-insulator ("SOI") substrate. In some embodiments, the device 100 has a layered construction. In some embodiments, the device 100 includes a handle wafer 110 having a first side 112 and a second side 114 opposite the first side 112. In some embodiments, the handle wafer 110 comprises high-resistivity silicon. In some embodiments, the handle wafer 110 comprises another suitable high-resistivity material. In some embodiments, the handle wafer 110 comprises a material having a resistivity in the range of 50 to 100 ohm-meters. In some embodiments, the thickness of the handle wafer is in the range of 500 to 700 microns.

In some embodiments, the device 100 includes a trap-rich layer 120 having a first side 122 and a second side 124 opposite the first side 122. In some embodiments, the trap-rich layer 120 is positioned adjacent the handle wafer 110 such that the first side 122 of the trap-rich layer 120 abuts the second side 114 of the handle wafer 110. In some embodiments, the trap-rich layer 120 includes silicon nitride. In some embodiments, the trap-rich layer 120 includes a silicon nitride layer positioned adjacent the handle wafer 110. In some embodiments, the trap-rich layer 120 has a thickness in the range of 100 to 1000 angstroms. In some embodiments, the trap-rich layer 120 has a thickness in the range of 100 to 400 angstroms. In some embodiments, the trap-rich layer 120 has a thickness in the range of 400 to 700 angstroms. In some embodiments, the trap-rich layer 120 has a thickness in the range of 700 to 1000 angstroms. In some embodiments, the trap-rich layer 120 has a thickness in the range of 100 to 700 angstroms. In some embodiments, the trap-rich layer 120 has a thickness in the range of 400 to 1000 angstroms. In some embodiments, variations in the thickness of the trap-rich layer 120 results in corresponding variations in the frequency isolation values of an RF device that is made using the device 100. In some embodiments, an increase in the thickness of the trap-rich layer 120 results in an increase in resistivity of the trap-rich layer 120, thereby providing a corresponding increase in frequency isolation of an RF device that is made using the device 100. In some embodiments, conversely, a decrease in the thickness of the trap-rich layer 120 results in a decrease in resistivity of the trap-rich layer 120, thereby providing a corresponding decrease in frequency isolation of an RF device that is made using the device 100.

In some embodiments, the device 100 includes a silicon dioxide ("$SiO_2$") layer 130 having a first side 132 and a second side 134 opposite the second side 132. In some embodiments, the $SiO_2$ layer 130 is positioned adjacent the trap-rich layer 120 such that the first side 132 of the $SiO_2$ layer 130 abuts the second side 124 of the trap-rich layer 120. In some embodiments, the $SiO_2$ layer 130 has a thickness in the range of 1000 to 5000 angstroms. In some embodiments, the $SiO_2$ layer 130 has a thickness in the range of 1000 to 2000 angstroms. In some embodiments, the $SiO_2$ layer 130 has a thickness in the range of 2000 to 3000 angstroms. In some embodiments, the $SiO_2$ layer 130 has a thickness in the range of 3000 to 4000 angstroms. In some embodiments, the $SiO_2$ layer 130 has a thickness in the range of 4000 to 5000 angstroms. In some embodiments, the $SiO_2$ layer 130 has a thickness in the range of 1000 to 3000 angstroms. In some embodiments, the $SiO_2$ layer 130 has a thickness in the range of 2000 to 4000 angstroms. In some embodiments, the $SiO_2$ layer 130 has a thickness in the range of 3000 to 5000 angstroms. In some embodiments, the $SiO_2$ layer 130 has a thickness in the range of 1000 to 4000 angstroms. In some embodiments, the $SiO_2$ layer 130 has a thickness in the range of 2000 to 5000 angstroms. In some embodiments, variations in the thickness of the $SiO_2$ layer 130 result in corresponding variations in the resistivity and capacitance of the $SiO_2$ layer 130. In some embodiments, an increase in the thickness of the $SiO_2$ layer 130 results in an increase in resistivity of the $SiO_2$ layer 130 and a decrease in the capacitance of the $SiO_2$ layer 130. In some embodiments, conversely, a decrease in the thickness of the $SiO_2$ layer 130 results in a decrease in resistivity of the $SiO_2$ layer 130 and an increase in the capacitance of the $SiO_2$ layer 130. In some embodiments, increased resistance caused by increased resistivity of the $SiO_2$ layer 130 has the effect of producing a longer time before a signal reaches a voltage threshold (i.e., a slower "on" speed), while decreased resistance caused by decreased resistivity of the $SiO_2$ layer 130 has the effect of producing a shorter time before a signal reaches a voltage threshold (i.e., a faster "on" speed). In some embodiments, increased capacitance of the $SiO_2$ layer 130 has the effect of producing a longer time before a decreasing signal bleeds off to the point that it is less than a voltage threshold (i.e., a slower "off" speed), while decreased capacitance of the $SiO_2$ layer 130 has the effect of producing a shorter time before a decreasing signal bleeds off to the point that it is less than a voltage threshold (i.e., a faster "off" speed). In some embodiments, an amplifier made using the device 100 with faster "on" and "off" speeds will have higher operational speeds.

In some embodiments, the device 100 includes a transfer layer 140 having a first side 142 and a second side 144 opposite the first side 142. In some embodiments, the transfer layer 140 is positioned adjacent the $SiO_2$ layer 130 such that the first side 142 of the transfer layer 140 abuts the second side 134 of the $SiO_2$ layer 130. In some embodiments, the transfer layer 140 has a thickness in the range of 500-5000 angstroms. In some embodiments, the transfer layer 140 has a thickness in the range of 500-2000 angstroms. In some embodiments, the transfer layer 140 has a thickness in the range of 2000-3500 angstroms. In some embodiments, the transfer layer 140 has a thickness in the range of 3500-5000 angstroms. In some embodiments, the transfer layer 140 has a thickness in the range of 500-3500 angstroms. In some embodiments, the transfer layer 140 has a thickness in the range of 2000-5000 angstroms. In some embodiments, an increase in the thickness of the transfer layer 140 results in an increase of a voltage threshold of an RF device that is made using the device 100. In some embodiments, conversely, a decrease in the thickness of the transfer layer 140 results in a decrease of a voltage threshold of an RF device that is made using the device 100. In some embodiments, the transfer layer 140 comprises a silicon wafer.

Figure 2:
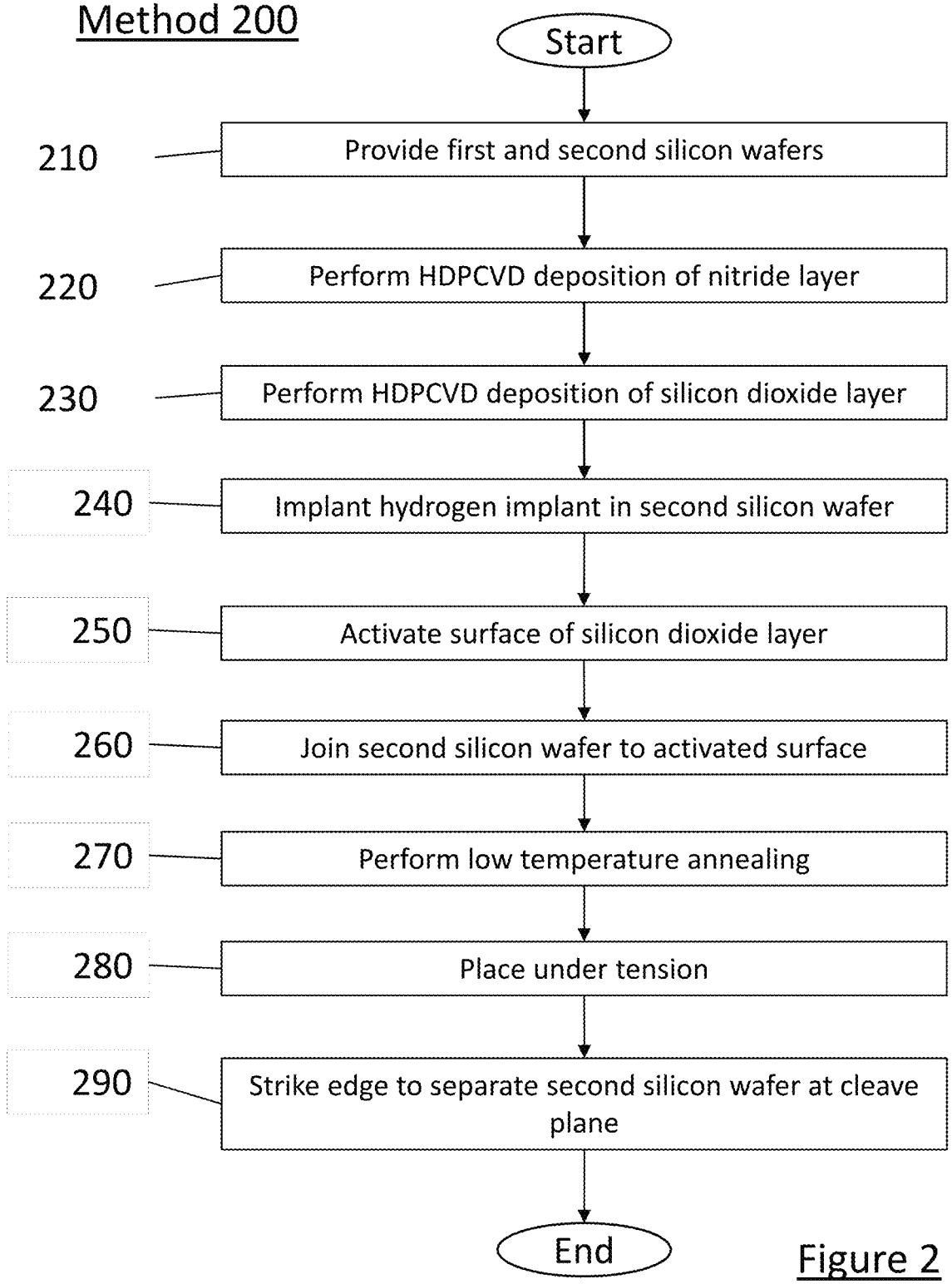
FIG. 2 shows a flowchart of an exemplary method for producing a silicon-on-insulator substrate such as that shown in FIG. 1.
Figure 3A:
FIG. 3A shows an intermediate product at a first stage of the exemplary method of FIG. 2.
Figure 3B:
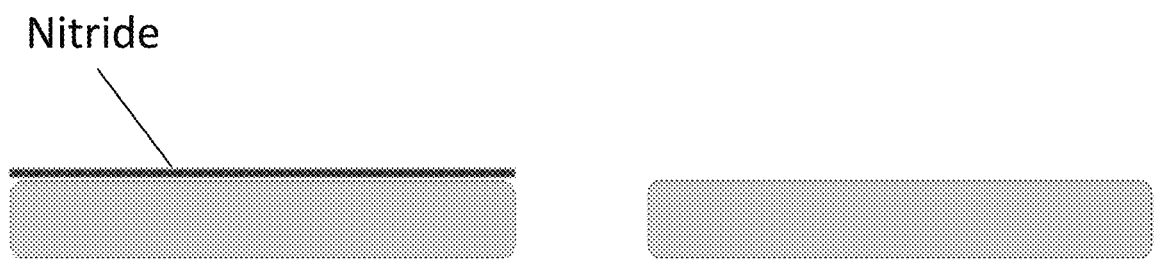
FIG. 3B shows an intermediate product at a second stage of the exemplary method of FIG. 2.
Figure 3C:
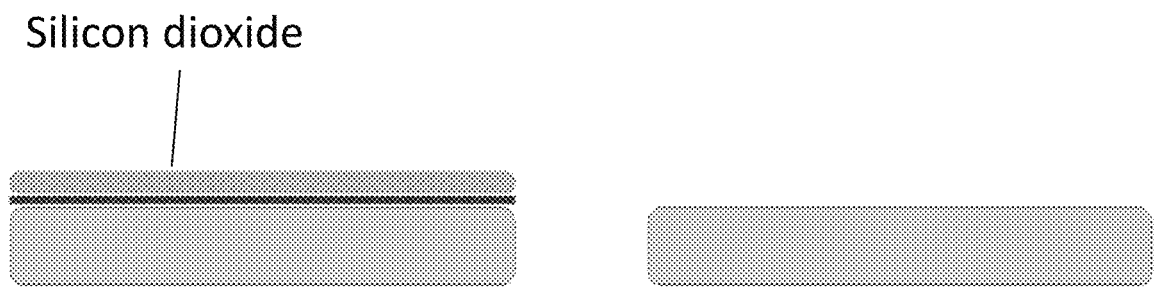
FIG. 3C shows an intermediate product at a third stage of the exemplary method of FIG. 2.
Figure 3D:
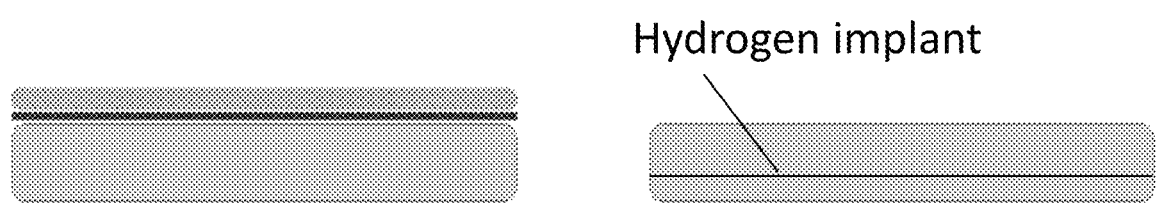
FIG. 3D shows an intermediate product at a fourth stage of the exemplary method of FIG. 2.
Figure 3E:
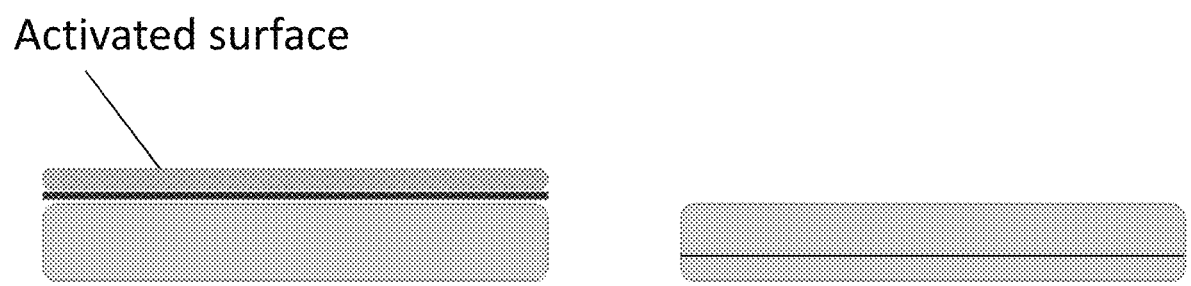
FIG. 3E shows an intermediate product at a fifth stage of the exemplary method of FIG. 2.
Figure 3F:
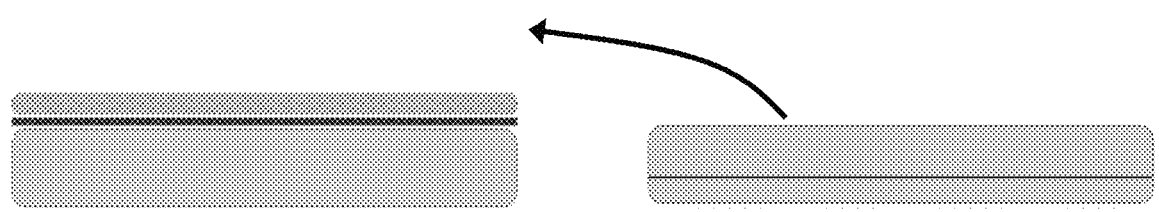
FIG. 3F shows an intermediate product at a sixth stage of the exemplary method of FIG. 2.
Figure 3G:
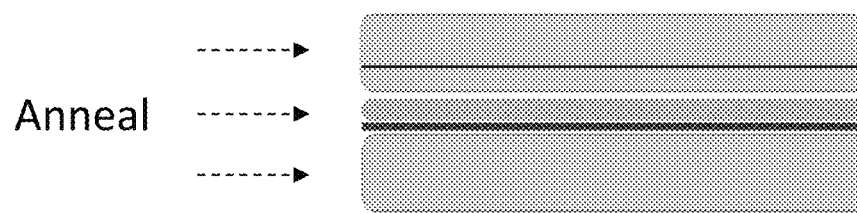
FIG. 3G shows an intermediate product at a seventh stage of the exemplary method of FIG. 2.
Figure 3H:
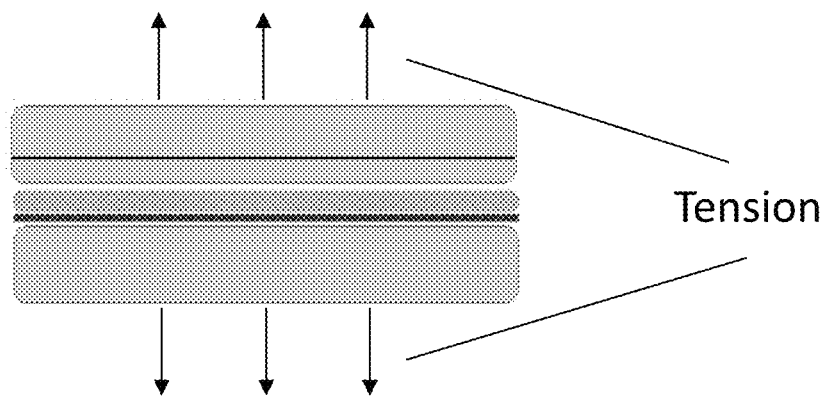
FIG. 3H shows an intermediate product at an eighth stage of the exemplary method of FIG. 2.
Figure 3I:
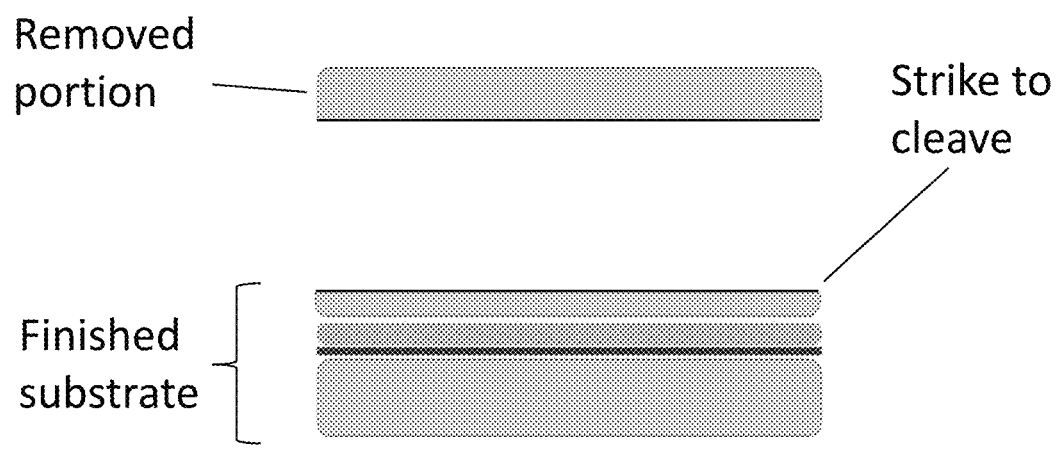
FIG. 3I shows a finished product following a ninth stage of the exemplary method of FIG. 2.

FIG. 2 shows a flowchart of an exemplary method 200 for producing the device 100. FIGS. 3A-3H show various intermediate products that exist during performance of the exemplary method 200 and FIG. 3I shows the final product of the performance of the exemplary method 200. In step 210, first and second silicon wafers are provided. In some embodiments, the thickness of each of the first and second silicon wafers is in the range of 500-700 microns. In some embodiments, the first silicon wafer is referred to herein as a handle wafer. As described above with reference to FIG. 1, in some embodiments, the handle wafer comprises high-resistivity silicon. FIG. 3A shows a schematic view of the first and second silicon wafers provided in step 210.

In step 220, a silicon nitride layer is deposited on the handle wafer provided in step 210. In some embodiments, the silicon nitride layer is deposited through the use of a high density plasma chemical vapor deposition ("HDPCVD") process. It will be understood by those of skill in the art that HDPCVD is a specific form of plasma-enhanced chemical vapor deposition ("PECVD") that employs either an inductively-coupled plasma ("ICP") source or an electron cyclotron resonance source to generate a higher plasma density than that of a standard PECVD system. In some embodiments, the HDPCVD process of step 220 is performed using an ICP source. In some embodiments, the HDPCVD process of step 220 is performed by introducing a mix of a plurality of gas flows to the handle wafer. In some embodiments, the gas mixture includes a flow of nitrogen gas (e.g., $N_2$), a flow of silane (e.g., $SiH_4$), and a flow of argon (e.g., Ar). In some embodiments, the relative flow rates of $N_2$ gas, silane gas, and argon gas are varied in order to control the properties of the deposited film, such as its refractive index. For example, in some embodiments, a flow ratio of 1:1 between $N_2$ gas and silane gas provides a refractive index of 1.46 and varying this ratio may raise or lower the refractive index. In some embodiments, increasing the flow rate of silane gas as compared to the flow rate of $N_2$ gas results in an increase in the silicon content of the silicon nitride layer, and thereby results in a decrease in the refractive index of the deposited film. In some embodiments, conversely, decreasing the flow rate of silane gas as compared to the flow rate of $N_2$ gas results in a decrease in the silicon content of the silicon nitride layer, and thereby results in an increase in the refractive index of the deposited film. FIG. 3B shows a schematic view of the first silicon wafer with silicon nitride layer deposited thereon and the second silicon wafer after the performance of step 220.

In some embodiments, the HDPCVD process of step 220 is performed using a configured pressure. In some embodiments, the pressure is between 5 millitorr and 20 millitorr. In some embodiments, the pressure is between 5 millitorr and 10 millitorr. In some embodiments, the pressure is between 10 millitorr and 15 millitorr. In some embodiments, the pressure is between 15 millitorr and 20 millitorr. In some embodiments, the pressure is between 5 millitorr and 15 millitorr. In some embodiments, the pressure is between 10 millitorr and 20 millitorr. In some embodiments, the pressure is between 7.5 millitorr and 12.5 millitorr. In some embodiments, the pressure is between 9 millitorr and 11 millitorr. In some embodiments, the pressure is about 10 millitorr. In some embodiments, the pressure is 10 millitorr. In some embodiments, the pressure is between 10 millitorr and 14 millitorr. In some embodiments, the pressure is between 11 millitorr and 13 millitorr. In some embodiments, the pressure is about 12 millitorr. In some embodiments, the pressure is 12 millitorr. In some embodiments, varying the pressure may result in varying degrees of film uniformity. For example, in some embodiments, a pressure of 12 millitorr produces a generally uniform film with about 1% non-uniformity and a slight bias toward the center of the wafer. In some embodiments, varying the pressure will change the center-to-edge rates and may therefore enable the uniformity to be adjusted. In some embodiments, changes in the pressure result in corresponding changes to a Debye sphere, which is a sphere of influence, and outside of which charges are screened. In some embodiments, an increase in the pressure used during the HDPCVD process of step 220 produces a larger Debye sphere, which results in an increase in the deposition rate at the edges as compared to the center. Conversely, in some embodiments, a decrease in the pressure used during the HDPCVD process of step 220 produces a smaller Debye sphere, which results in a decrease in the deposition rate at the edges as compared to the center. Consequently, in some embodiments, the pressure used during the HDPCVD process of step 220 can be tuned to adjust the uniformity of the deposited film.

In some embodiments, the HDPCVD process of step 220 is performed using an ICP source operating at a configured ICP power. In some embodiments, the ICP power is between 65 watts and 225 watts. In some embodiments, the ICP power is between 65 watts and 105 watts. In some embodiments, the ICP power is between 105 watts and 145 watts. In some embodiments, the ICP power is between 145 watts and 185 watts. In some embodiments, the ICP power is between 185 watts and 225 watts. In some embodiments, the ICP power is between 65 watts and 145 watts. In some embodiments, the ICP power is between 105 watts and 185 watts. In some embodiments, the ICP power is between 145 watts and 225 watts. In some embodiments, the ICP power is between 65 watts and 185 watts. In some embodiments, the ICP power is between 145 watts and 225 watts. In some embodiments, varying the ICP power results in varying degrees of film uniformity. In some embodiments, changes in the ICP power result in corresponding changes to a Debye sphere, which is a sphere of influence, and outside of which charges are screened. In some embodiments, an increase in the ICP power used during the HDPCVD process of step 220 produces a smaller Debye sphere, which results in a decrease in the deposition rate at the edges as compared to the center. Conversely, in some embodiments, a decrease in the ICP power used during the HDPCVD process of step 220 produces a larger Debye sphere, which results in an increase in the deposition rate at the edges as compared to the center. Consequently, in some embodiments, the ICP power used during the HDPCVD process of step 220 can be tuned to adjust the uniformity of the deposited film.

In some embodiments, the HDPCVD process of step 220 is performed using a configured bias power. In some embodiments, the bias power is between 0 and 100 watts. In some embodiments, the bias power is between 0 watts and 25 watts. In some embodiments, the bias power is between 25 watts and 50 watts. In some embodiments, the bias power is between 50 watts and 75 watts. In some embodiments, the bias power is between 75 watts and 100 watts. In some embodiments, the bias power is between 0 watts and 50 watts. In some embodiments, the bias power is between 25 watts and 75 watts. In some embodiments, the bias power is between 50 watts and 100 watts. In some embodiments, the bias power is between 0 watts and 75 watts. In some embodiments, the bias power is between 25 watts and 100 watts. In some embodiments, varying the bias power results in varying the density of the film. In some embodiments, varying the bias power results in varying the percentage of hydrogen in the deposited film, thereby varying the density of the deposited film. In some embodiments, a film that has a lower hydrogen content will be denser and a film that has a higher hydrogen content will be less dense. In some embodiments, an increase in bias power increases the speed of hydrogen in the plasma state, thereby producing a film that has a lower hydrogen content. In some embodiments, conversely, a decrease in bias power decreases the speed of hydrogen in the plasma state, thereby producing a film that has a higher hydrogen content. In some embodiments, varying the bias power results in varying the film uniformity. In some embodiments, increasing the bias power increases the electrode field generated from the lower electrode, thereby increasing the uniformity of the film. In some embodiments, conversely, decreasing the bias power decreases the electrode field generated from the lower electrode, thereby decreasing the uniformity of the film.

In some embodiments, the HDPCVD process of step 220 is performed with the handle wafer held at a configured temperature. In some embodiments, the temperature is between 100 and 250 degrees Celsius. In some embodiments, the temperature is between 100 and 150 degrees Celsius. In some embodiments, the temperature is between 150 and 200 degrees Celsius. In some embodiments, the temperature is between 200 and 250 degrees Celsius. In some embodiments, the temperature is between 100 and 200 degrees Celsius. In some embodiments, the temperature is between 150 and 250 degrees Celsius. In some embodiments, varying the handle wafer temperature results in varying the percentage of hydrogen in the deposited film, thereby varying the density of the deposited film. In some embodiments, a film that has a lower hydrogen content will be denser and a film that has a higher hydrogen content will be less dense. In some embodiments, increasing the temperature of the handle wafer decreases the hydrogen content of the film. In some embodiments, conversely, decreasing the temperature of the handle wafer increases the hydrogen content of the film. In some embodiments, varying the handle wafer temperature results in varying the deposition rate of the film. In some embodiments, increasing the temperature of the handle wafer decreases the RF energy needed to break down the silane gas into silicon and hydrogen and increases the time of recombination, thereby increasing the deposition rate. In some embodiments, conversely, decreasing the temperature of the handle wafer increases the RF energy needed to break down the silane gas into silicon and hydrogen and decreases the time of recombination, thereby decreasing the deposition rate.

In some embodiments, the HDPCVD process of step 220 is performed with the flow rate of $N_2$ gas at a configured flow rate. In some embodiments, the flow rate of $N_2$ gas is in a range of between 20 and 35 standard cubic centers per minute ("sccm"). In some embodiments, the flow rate of $N_2$ gas is a range of between 20 and 25 sccm. In some embodiments, the flow rate of $N_2$ gas is a range of between 25 and 30 sccm. In some embodiments, the flow rate of $N_2$ gas is a range of between 30 and 35 sccm. In some embodiments, the flow rate of $N_2$ gas is a range of between 20 and 30 sccm. In some embodiments, the flow rate of $N_2$ gas is a range of between 25 and 35 sccm.

In some embodiments, the HDPCVD process of step 220 is performed with the flow rate of silane gas at a configured flow rate. In some embodiments, the flow rate of silane gas is in a range of between 20 and 35 sccm. In some embodiments, the flow rate of silane gas is a range of between 20 and 25 sccm. In some embodiments, the flow rate of silane gas is a range of between 25 and 30 sccm. In some embodiments, the flow rate of silane gas is a range of between 30 and 35 sccm. In some embodiments, the flow rate of silane gas is a range of between 20 and 30 sccm. In some embodiments, the flow rate of silane gas is a range of between 25 and 35 sccm.

In some embodiments, the HDPCVD process of step 220 is performed with the flow rate of argon gas at a configured flow rate. In some embodiments, the flow rate of argon gas is in a range of between 20 and 35 sccm. In some embodiments, the flow rate of argon gas is a range of between 20 and 25 sccm. In some embodiments, the flow rate of argon gas is a range of between 25 and 30 sccm. In some embodiments, the flow rate of argon gas is a range of between 30 and 35 sccm. In some embodiments, the flow rate of argon gas is a range of between 20 and 30 sccm. In some embodiments, the flow rate of argon gas is a range of between 25 and 35 sccm.

In some embodiments, the parameters of the HDPCVD process of step 220 are configured so as to provide a controlled deposition rate of the silicon nitride layer on the handle wafer. In some embodiments, the deposition rate of the silicon nitride layer is between 300 and 500 angstroms per minute. In some embodiments, the deposition rate of the silicon nitride layer is between 350 and 450 angstroms per minute. In some embodiments, the deposition rate of the silicon nitride layer is between 375 and 425 angstroms per minute. In some embodiments, the deposition rate of the silicon nitride layer is about 400 angstroms per minute. In some embodiments, the deposition rate of the silicon nitride layer is 400 angstroms per minute.

In some embodiments, the parameters of the HDPCVD process of step 220 are configured so as to provide a controlled thickness of the silicon nitride layer on the handle wafer. In some embodiments, the parameters of the HDPCVD process of step 220 are configured so as to provide a thickness of the silicon nitride layer that is between 300 and 500 angstroms. In some embodiments, the thickness of the silicon nitride layer is between 350 and 450 angstroms. In some embodiments, the thickness of the silicon nitride layer is between 375 and 425 angstroms. In some embodiments, the thickness of the silicon nitride layer is about 400 angstroms. In some embodiments, the thickness of the silicon nitride layer is 400 angstroms. In some embodiments, the HDPCVD process of step 220 is performed for one minute.

Continuing to refer to FIG. 2, in step 230, a silicon dioxide layer is deposited on the handle wafer so as to overlay the silicon nitride layer deposited in step 220. In some embodiments, the silicon dioxide layer is deposited through the use of a HDPCVD process. In some embodiments, the HDPCVD process of step 230 is performed using an ICP source. In some embodiments, the HDPCVD process of step 230 is performed by introducing a mix of a plurality of gas flows to the handle wafer with the silicon nitride layer deposited thereon. In some embodiments, the gas mixture includes a flow of oxygen gas (e.g., $O_2$), a flow of silane (e.g., $SiH_4$), and a flow of argon (e.g., Ar). In some embodiments, the HDPCVD process of step 230 is substantially a continuation of the HDPCVD process of step 220 but for the substitution of the oxygen gas used in step 230 in place of the nitrogen gas used in step 220. FIG. 3C shows a schematic view of the first silicon wafer with silicon nitride and silicon dioxide layers deposited thereon and the second silicon wafer after the performance of step 230.

In some embodiments, the HDPCVD process of step 230 is performed using a configured pressure. In some embodiments, the pressure is between 5 millitorr and 20 millitorr. In some embodiments, the pressure is between 5 millitorr and 10 millitorr. In some embodiments, the pressure is between 10 millitorr and 15 millitorr. In some embodiments, the pressure is between 15 millitorr and 20 millitorr. In some embodiments, the pressure is between 5 millitorr and 15 millitorr. In some embodiments, the pressure is between 10 millitorr and 20 millitorr. In some embodiments, varying the pressure may result in varying degrees of film uniformity. For example, in some embodiments, a pressure of 12 millitorr produces a generally uniform film with about 1% non-uniformity and a slight bias toward the center of the wafer. In some embodiments, varying the pressure will change the center-to-edge rates and may therefore enable the uniformity to be adjusted. In some embodiments, changes in the pressure result in corresponding changes to a Debye sphere, which is a sphere of influence, and outside of which charges are screened. In some embodiments, an increase in the pressure used during the HDPCVD process of step 230 produces a larger Debye sphere, which results in an increase in the deposition rate at the edges as compared to the center. Conversely, in some embodiments, a decrease in the pressure used during the HDPCVD process of step 230 produces a smaller Debye sphere, which results in a decrease in the deposition rate at the edges as compared to the center. Consequently, in some embodiments, the pressure used during the HDPCVD process of step 230 can be tuned to adjust the uniformity of the deposited film.

In some embodiments, the HDPCVD process of step 230 is performed using an ICP source operating at a configured ICP power. In some embodiments, the ICP power is between 65 watts and 225 watts. In some embodiments, the ICP power is between 65 watts and 105 watts. In some embodiments, the ICP power is between 105 watts and 145 watts. In some embodiments, the ICP power is between 145 watts and 185 watts. In some embodiments, the ICP power is between 185 watts and 225 watts. In some embodiments, the ICP power is between 65 watts and 145 watts. In some embodiments, the ICP power is between 105 watts and 185 watts. In some embodiments, the ICP power is between 145 watts and 225 watts. In some embodiments, the ICP power is between 65 watts and 185 watts. In some embodiments, the ICP power is between 145 watts and 225 watts. In some embodiments, varying the ICP power results in varying degrees of film uniformity. In some embodiments, changes in the ICP power result in corresponding changes to a Debye sphere, which is a sphere of influence, and outside of which charges are screened. In some embodiments, an increase in the ICP power used during the HDPCVD process of step 230 produces a smaller Debye sphere, which results in a decrease in the deposition rate at the edges as compared to the center. Conversely, in some embodiments, a decrease in the ICP power used during the HDPCVD process of step 230 produces a larger Debye sphere, which results in an increase in the deposition rate at the edges as compared to the center. Consequently, in some embodiments, the ICP power used during the HDPCVD process of step 230 can be tuned to adjust the uniformity of the deposited film.

In some embodiments, the HDPCVD process of step 230 is performed using a configured bias power. In some embodiments, the bias power is between 0 and 100 watts. In some embodiments, the bias power is between 0 watts and 25 watts. In some embodiments, the bias power is between 25 watts and 50 watts. In some embodiments, the bias power is between 50 watts and 75 watts. In some embodiments, the bias power is between 75 watts and 100 watts. In some embodiments, the bias power is between 0 watts and 50 watts. In some embodiments, the bias power is between 25 watts and 75 watts. In some embodiments, the bias power is between 50 watts and 100 watts. In some embodiments, the bias power is between 0 watts and 75 watts. In some embodiments, the bias power is between 25 watts and 100 watts. In some embodiments, varying the bias power results in varying the density of the film. In some embodiments, varying the bias power results in varying the percentage of hydrogen in the deposited film, thereby varying the density of the deposited film. In some embodiments, a film that has a lower hydrogen content will be denser and a film that has a higher hydrogen content will be less dense. In some embodiments, an increase in bias power increases the speed of hydrogen in the plasma state, thereby producing a film that has a lower hydrogen content. In some embodiments, conversely, a decrease in bias power decreases the speed of hydrogen in the plasma state, thereby producing a film that has a higher hydrogen content. In some embodiments, varying the bias power results in varying the film uniformity. In some embodiments, increasing the bias power increases the electrode field generated from the lower electrode, thereby increasing the uniformity of the film. In some embodiments, conversely, decreasing the bias power decreases the electrode field generated from the lower electrode, thereby decreasing the uniformity of the film.

In some embodiments, the HDPCVD process of step 230 is performed with the handle wafer held at a configured temperature. In some embodiments, the temperature is between 100 and 250 degrees Celsius. In some embodiments, the temperature is between 100 and 150 degrees Celsius. In some embodiments, the temperature is between 150 and 200 degrees Celsius. In some embodiments, the temperature is between 200 and 250 degrees Celsius. In some embodiments, the temperature is between 100 and 200 degrees Celsius. In some embodiments, the temperature is between 150 and 250 degrees Celsius. In some embodiments, varying the handle wafer temperature results in varying the percentage of hydrogen in the deposited film, thereby varying the density of the deposited film. In some embodiments, a film that has a lower hydrogen content will be denser and a film that has a higher hydrogen content will be less dense. In some embodiments, increasing the temperature of the handle wafer decreases the hydrogen content of the film. In some embodiments, conversely, decreasing the temperature of the handle wafer increases the hydrogen content of the film. In some embodiments, varying the handle wafer temperature results in varying the deposition rate of the film. In some embodiments, increasing the temperature of the handle wafer decreases the RF energy needed to break down the silane gas into silicon and hydrogen and increases the time of recombination, thereby increasing the deposition rate. In some embodiments, conversely, decreasing the temperature of the handle wafer increases the RF energy needed to break down the silane gas into silicon and hydrogen and decreases the time of recombination, thereby decreasing the deposition rate.

In some embodiments, the HDPCVD process of step 230 is performed with the flow rate of $O_2$ gas at a configured flow rate. In some embodiments, the flow rate of $O_2$ gas is in a range of between 20 and 35 sccm. In some embodiments, the flow rate of $O_2$ gas is a range of between 20 and 25 sccm. In some embodiments, the flow rate of $O_2$ gas is a range of between 25 and 30 sccm. In some embodiments, the flow rate of $O_2$ gas is a range of between 30 and 35 sccm. In some embodiments, the flow rate of $O_2$ gas is a range of between 20 and 30 sccm. In some embodiments, the flow rate of $O_2$ gas is a range of between 25 and 35 sccm.

In some embodiments, the HDPCVD process of step 230 is performed with the flow rate of silane gas at a configured flow rate. In some embodiments, the flow rate of silane gas is in a range of between 20 and 35 sccm. In some embodiments, the flow rate of silane gas is a range of between 20 and 25 sccm. In some embodiments, the flow rate of silane gas is a range of between 25 and 30 sccm. In some embodiments, the flow rate of silane gas is a range of between 30 and 35 sccm. In some embodiments, the flow rate of silane gas is a range of between 20 and 30 sccm. In some embodiments, the flow rate of silane gas is a range of between 25 and 35 sccm.

In some embodiments, the HDPCVD process of step 230 is performed with the flow rate of argon gas at a configured flow rate. In some embodiments, the flow rate of argon gas is in a range of between 20 and 35 sccm. In some embodiments, the flow rate of argon gas is a range of between 20 and 25 sccm. In some embodiments, the flow rate of argon gas is a range of between 25 and 30 sccm. In some embodiments, the flow rate of argon gas is a range of between 30 and 35 sccm. In some embodiments, the flow rate of argon gas is a range of between 20 and 30 sccm. In some embodiments, the flow rate of argon gas is a range of between 25 and 35 sccm.

In some embodiments, the parameters of the HDPCVD process of step 230 are configured so as to provide a controlled deposition rate of the silicon dioxide layer on the handle wafer. In some embodiments, the deposition rate of the silicon dioxide layer is between 900 and 1100 angstroms per minute. In some embodiments, the deposition rate of the silicon dioxide layer is between 950 and 1050 angstroms per minute. In some embodiments, the deposition rate of the silicon dioxide layer is between 975 and 1025 angstroms per minute. In some embodiments, the deposition rate of the silicon dioxide layer is about 1000 angstroms per minute. In some embodiments, the deposition rate of the silicon dioxide layer is 1000 angstroms per minute.

In some embodiments, the parameters of the HDPCVD process of step 230 are configured so as to provide a controlled thickness of the silicon dioxide layer on the handle wafer. In some embodiments, the thickness of the silicon dioxide layer is between 1500 and 5000 angstroms. In some embodiments, the thickness of the silicon dioxide layer is between 1500 and 2000 angstroms. In some embodiments, the thickness of the silicon dioxide layer is between 2000 and 2500 angstroms. In some embodiments, the thickness of the silicon dioxide layer is between 2500 and 3000 angstroms. In some embodiments, the thickness of the silicon dioxide layer is between 3000 and 3500 angstroms. In some embodiments, the thickness of the silicon dioxide layer is between 3500 and 4000 angstroms. In some embodiments, the thickness of the silicon dioxide layer is between 4000 and 4500 angstroms. In some embodiments, the thickness of the silicon dioxide layer is between 4500 and 5000 angstroms. In some embodiments, the thickness of the silicon dioxide layer is between 1500 and 2500 angstroms. In some embodiments, the thickness of the silicon dioxide layer is between 2000 and 3000 angstroms. In some embodiments, the thickness of the silicon dioxide layer is between 2500 and 3500 angstroms. In some embodiments, the thickness of the silicon dioxide layer is between 3000 and 4000 angstroms. In some embodiments, the thickness of the silicon dioxide layer is between 3500 and 4500 angstroms. In some embodiments, the thickness of the silicon dioxide layer is between 4000 and 5000 angstroms. In some embodiments, the thickness of the silicon dioxide layer is between 1500 and 3000 angstroms. In some embodiments, the thickness of the silicon dioxide layer is between 2000 and 3500 angstroms. In some embodiments, the thickness of the silicon dioxide layer is between 2500 and 4000 angstroms. In some embodiments, the thickness of the silicon dioxide layer is between 3000 and 4500 angstroms. In some embodiments, the thickness of the silicon dioxide layer is between 3500 and 5000 angstroms. In some embodiments, the thickness of the silicon dioxide layer is between 1500 and 3500 angstroms. In some embodiments, the thickness of the silicon dioxide layer is between 2000 and 4000 angstroms. In some embodiments, the thickness of the silicon dioxide layer is between 2500 and 4500 angstroms. In some embodiments, the thickness of the silicon dioxide layer is between 3000 and 5000 angstroms. In some embodiments, the thickness of the silicon dioxide layer is between 1500 and 4000 angstroms. In some embodiments, the thickness of the silicon dioxide layer is between 2000 and 4500 angstroms. In some embodiments, the thickness of the silicon dioxide layer is between 2500 and 5000 angstroms. In some embodiments, the thickness of the silicon dioxide layer is between 1500 and 4500 angstroms. In some embodiments, the thickness of the silicon dioxide layer is between 2000 and 5000 angstroms. In some embodiments, the HDPCVD process of step 230 is performed for a duration of between two and three minutes so as to achieve the controlled thickness of the silicon dioxide layer.

Continuing to refer to FIG. 2, in step 240, a hydrogen implant is implanted in the second wafer. In some embodiments, the hydrogen implant is positioned so as to define a cleave plane in the second wafer. In some embodiments, the cleave plane defines a desired thickness of the second silicon wafer following the completion of the method 200. In some embodiments, the hydrogen implant is implanted using an ion implanter. In some embodiments, the ion implanter is an ion implanter such as those commercialized by Nissin Ion Equipment Co. Ltd. of Kyoto, Japan. In some embodiments, the ion implanter is configured to emit a beam of hydrogen ions. In some embodiments, the ion implanter is configured to operate at a power of between 5000 volts and 1 megavolt. In some embodiments, the desired thickness is in the range of 500-5000 angstroms. In some embodiments, the desired thickness is in the range of 500-2000 angstroms. In some embodiments, the desired thickness is in the range of 2000-3500 angstroms. In some embodiments, the desired thickness is in the range of 3500-5000 angstroms. In some embodiments, the desired thickness is in the range of 500-3500 angstroms. In some embodiments, the desired thickness is in the range of 2000-5000 angstroms. In some embodiments, implanted hydrogen generates displacement damage in the form of interstitials, vacancies, and complexes. In some embodiments, such defects generate areas with a high number of broken bonds called platelets. In some embodiments, hydrogen is trapped at these surfaces, passivating the broken bonds. FIG. 3D shows a schematic view of the first silicon wafer with silicon nitride and silicon dioxide layers deposited thereon and the second silicon wafer with the hydrogen implant implanted therein after the performance of step 240.

Continuing to refer to FIG. 2, in step 250, the surface of the silicon dioxide layer that was deposited in step 230 is activated. In some embodiments, the activation is plasma activation that is performed by bombarding the surface of the silicon dioxide layer with short-lived chemical species produced within the plasma volume to initiate chemical reactions at the surface and enable adhesion. In some embodiments, the activation is low-pressure plasma-activated bonding at a pressure in a range of between 0.1 and 100 Pa. FIG. 3E shows a schematic view of the first silicon wafer with the silicon nitride and activated silicon dioxide layers deposited thereon and the second silicon wafer with the hydrogen implant implanted therein after the performance of step 250.

Continuing to refer to FIG. 2, in step 260, the first silicon wafer (i.e., having silicon nitride and silicon dioxide layers deposited thereon) is brought together with the second silicon wafer (i.e., having a hydrogen implant therein) such that the activated surface of the silicon dioxide layer faces the second silicon wafer, and with the second silicon wafer oriented such that, after cleavage along the cleave plane defined by the hydrogen implant, the desired portion of the second silicon wafer (i.e., the portion having a thickness as discussed above) will remain adjacent to the first silicon wafer. FIG. 3F shows a schematic view of the joining of the first silicon wafer with the silicon nitride and activated silicon dioxide layers deposited thereon to the second silicon wafer with the hydrogen implant implanted therein in accordance with the performance of step 260.

Continuing to refer to FIG. 2, in step 270, the joined first and second silicon wafers are subjected to a low temperature annealing process. In some embodiments, the temperature used in the annealing process is in the range of 200 to 400 degrees Celsius. In some embodiments, a temperature used in the annealing process is in the range of 200 to 250 degrees Celsius. In some embodiments, a temperature used in the annealing process is in the range of 250 to 300 degrees Celsius. In some embodiments, a temperature used in the annealing process is in the range of 300 to 350 degrees Celsius. In some embodiments, a temperature used in the annealing process is in the range of 350 to 400 degrees Celsius. In some embodiments, a temperature used in the annealing process is in the range of 200 to 300 degrees Celsius. In some embodiments, a temperature used in the annealing process is in the range of 250 to 350 degrees Celsius. In some embodiments, a temperature used in the annealing process is in the range of 300 to 400 degrees Celsius. In some embodiments, a temperature used in the annealing process is in the range of 200 to 350 degrees Celsius. In some embodiments, a temperature used in the annealing process is in the range of 250 to 400 degrees Celsius. In some embodiments, a duration of the annealing process is between one hour and eight hours. In some embodiments, during the annealing process, the trapped hydrogen discussed above with reference to step 240 dissociates from complexes and diffuses into the platelets, forming $H_2$ molecules. In some embodiments, due to the pressure increase, the platelets expand into micro cracks which join together in the same plane, causing material exfoliation. FIG. 3G shows a schematic illustration of the annealing process of step 270.

Continuing to refer to FIG. 2, in step 280, the joined first and second silicon wafers are placed under tension (i.e., are tensioned so as to force the first and second silicon wafers away from one another. In some embodiments, the tensioning is at a force sufficient to produce a tension that is in the range of 10 to 60 pounds per square inch across the joined area. FIG. 3H shows a schematic illustration of the tensioning process of step 280.

Continuing to refer to FIG. 2, in step 290, the second silicon wafer is struck at the cleave plane defined by the hydrogen implant. In some embodiments, the second silicon wafer is struck using a thin blade-like element using an applied force that is in the range of 5-10 pounds per square inch across the target area to initiate a debond wave. In some embodiments, the thin blade-like element is any suitable object having a suitable width. In some embodiments, the suitable width is about 50 microns. As a result of this strike, the portion of the second silicon wafer (which may be referred to in this context as a "donor wafer") that is positioned between the hydrogen implant and the first silicon wafer remains attached to the first silicon wafer (which may be referred to in this context as a "handle wafer"), while the remaining portion of the second silicon wafer is cleaved therefrom. Following this cleaving step, the finished wafer has been produced. FIG. 3I shows a schematic illustration of the finished wafer and the removed portion of the second silicon wafer following the performance of step 290.

Figure 4:
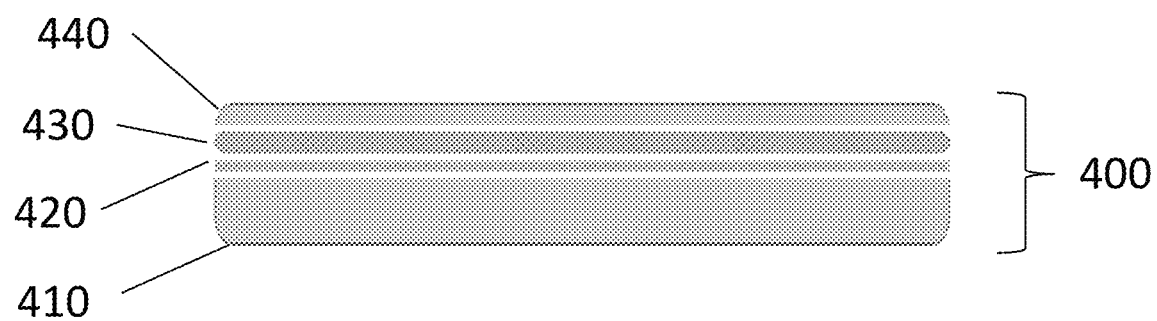
FIG. 4 shows an exemplary silicon-on-insulator substrate that is suitable for applications such as in the fabrication of RF systems.

FIG. 4 shows a schematic view of a second exemplary device 400. In some embodiments, the device 400 may be termed a silicon-on-insulator ("SOI") substrate. In some embodiments, the device 400 has a layered construction. In some embodiments, the device 400 includes a handle wafer 410 having a first side 412 and a second side 414 opposite the first side 412. In some embodiments, the handle wafer 410 comprises high-resistivity silicon. In some embodiments, the handle wafer 410 comprises another suitable high-resistivity material. In some embodiments, the handle wafer 410 comprises a material having a resistivity in the range of 50 to 100 ohm-meters. In some embodiments, the thickness of the handle wafer is in the range of 500 to 700 microns. In some embodiments, the thickness of the handle wafer is in the range of 550 to 650 microns.

In some embodiments, the device 400 includes a trap-rich layer 420 having a first side 422 and a second side 424 opposite the first side 422. In some embodiments, the trap-rich layer 420 is positioned within the handle wafer 410 such that the first side 422 of the trap-rich layer 420 is located between the first and second sides 412, 414 of the handle wafer 410 and the second side 424 of the trap-rich layer 420 is positioned at the second side 414 of the handle wafer 410. In some embodiments, the trap-rich layer 420 includes arsenic. In some embodiments, the trap-rich layer 420 includes diffused arsenic. In some embodiments, the trap-rich layer 420 includes a trap-rich arsenic region positioned within (e.g., diffused into the second side 414 of) the handle wafer 410, e.g., a region in which the arsenic is interspersed within the crystalline structure of the handle wafer 410. In some embodiments, the trap-rich layer 420 has a thickness in the range of 1 to 10 microns. In some embodiments, the trap-rich layer 420 has a thickness in the range of 1 to 4 microns. In some embodiments, the trap-rich layer 420 has a thickness in the range of 4 to 7 microns. In some embodiments, the trap-rich layer 420 has a thickness in the range of 7 to 10 microns. In some embodiments, the trap-rich layer 420 has a thickness in the range of 1 to 7 microns. In some embodiments, the trap-rich layer 420 has a thickness in the range of 4 to 10 microns. In some embodiments, variations in the thickness of the trap-rich layer 420 results in corresponding variations in the charge dissipation of the trap-rich layer 420. In some embodiments, the diffused arsenic creates broken bonds in the silicon lattice of the handle wafer, resulting in a quicker dissipation path and faster dissipation speeds. Consequently, in some embodiments, an increase in the thickness of the trap-rich layer 420 results in a chip that is suitable for lower operational frequencies, as lower frequencies produce deeper current flow. In some embodiments, conversely, a decrease in the thickness of the trap-rich layer 420 results in a chip that is suitable for higher operational frequencies, as higher frequencies produce shallower current flow.

In some embodiments, the device 400 includes a silicon dioxide ("$SiO_2$") layer 430 having a first side 432 and a second side 434 opposite the second side 432. In some embodiments, the $SiO_2$ layer 430 is positioned adjacent the trap-rich layer 420 such that the first side 432 of the $SiO_2$ layer 430 abuts the second side 424 of the trap-rich layer 420. In some embodiments, the $SiO_2$ layer 430 has a thickness in the range of 1000 to 5000 angstroms. In some embodiments, the $SiO_2$ layer 430 has a thickness in the range of 1000 to 2000 angstroms. In some embodiments, the $SiO_2$ layer 430 has a thickness in the range of 2000 to 3000 angstroms. In some embodiments, the $SiO_2$ layer 430 has a thickness in the range of 3000 to 4000 angstroms. In some embodiments, the $SiO_2$ layer 430 has a thickness in the range of 4000 to 5000 angstroms. In some embodiments, the $SiO_2$ layer 430 has a thickness in the range of 1000 to 3000 angstroms. In some embodiments, the $SiO_2$ layer 430 has a thickness in the range of 2000 to 4000 angstroms. In some embodiments, the $SiO_2$ layer 430 has a thickness in the range of 3000 to 5000 angstroms. In some embodiments, the $SiO_2$ layer 430 has a thickness in the range of 1000 to 4000 angstroms. In some embodiments, the $SiO_2$ layer 430 has a thickness in the range of 2000 to 5000 angstroms. In some embodiments, variations in the thickness of the $SiO_2$ layer 430 result in corresponding variations in the resistivity and capacitance of the $SiO_2$ layer 430. In some embodiments, an increase in the thickness of the $SiO_2$ layer 430 results in an increase in resistivity of the $SiO_2$ layer 430 and a decrease in the capacitance of the $SiO_2$ layer 430. In some embodiments, conversely, a decrease in the thickness of the $SiO_2$ layer 430 results in a decrease in resistivity of the $SiO_2$ layer 430 and an increase in the capacitance of the $SiO_2$ layer 430. In some embodiments, increased resistance caused by increased resistivity of the $SiO_2$ layer 430 has the effect of producing a longer time before a signal reaches a voltage threshold (i.e., a slower "on" speed), while decreased resistance caused by decreased resistivity of the $SiO_2$ layer 430 has the effect of producing a shorter time before a signal reaches a voltage threshold (i.e., a faster "on" speed). In some embodiments, increased capacitance of the SiO$_2$ layer 430 has the effect of producing a longer time before a decreasing signal bleeds off to the point that it is less than a voltage threshold (i.e., a slower "off" speed), while decreased capacitance of the SiO$_2$ layer 430 has the effect of producing a shorter time before a decreasing signal bleeds off to the point that it is less than a voltage threshold (i.e., a faster "off" speed). In some embodiments, an amplifier made using the device 400 with faster "on" and "off" speeds will have higher operational speeds.

In some embodiments, the device 400 includes a transfer layer 440 having a first side 442 and a second side 444 opposite the first side 442. In some embodiments, the transfer layer 440 is positioned adjacent the SiO$_2$ layer 430 such that the first side 442 of the transfer layer 440 abuts the second side 434 of the SiO$_2$ layer 430. In some embodiments, the transfer layer 440 has a thickness in the range of 500-5000 angstroms. In some embodiments, the transfer layer 440 has a thickness in the range of 500-2000 angstroms. In some embodiments, the transfer layer 440 has a thickness in the range of 2000-3500 angstroms. In some embodiments, the transfer layer 440 has a thickness in the range of 3500-5000 angstroms. In some embodiments, the transfer layer 440 has a thickness in the range of 500-3500 angstroms. In some embodiments, the transfer layer 440 has a thickness in the range of 2000-5000 angstroms. In some embodiments, an increase in the thickness of the transfer layer 440 results in an increase of a voltage threshold of an RF device that is made using the device 400. In some embodiments, conversely, a decrease in the thickness of the transfer layer 440 results in a decrease of a voltage threshold of an RF device that is made using the device 400. In some embodiments, the transfer layer 440 comprises a silicon wafer.

Figure 5:
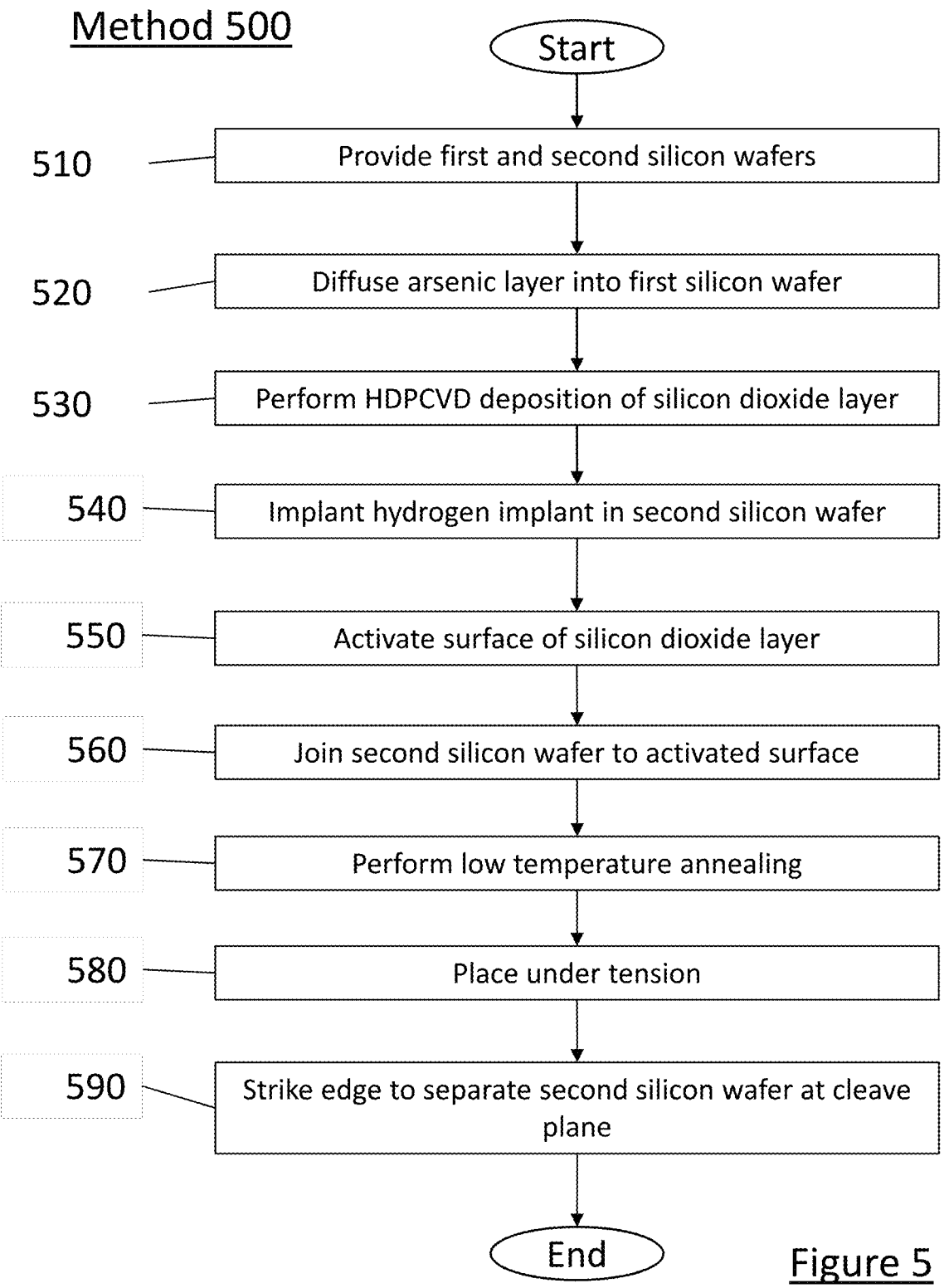
FIG. 5 shows a flowchart of an exemplary method for producing a silicon-on-insulator substrate such as that shown in FIG. 4.
Figure 6A:
FIG. 6A shows an intermediate product at a first stage of the exemplary method of FIG. 5.
Figure 6B:
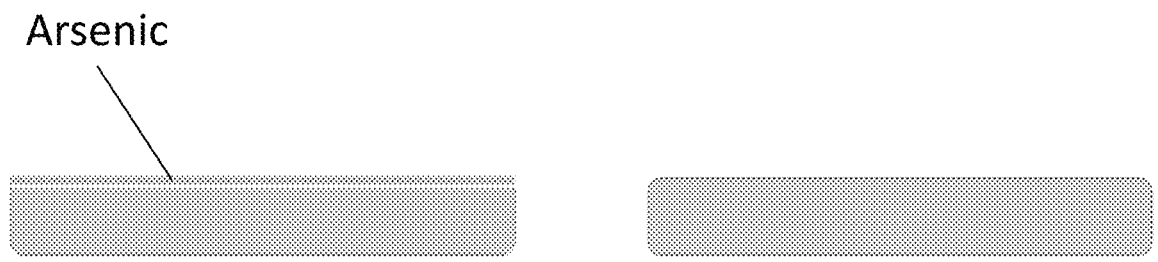
FIG. 6B shows an intermediate product at a second stage of the exemplary method of FIG. 5.
Figure 5C:
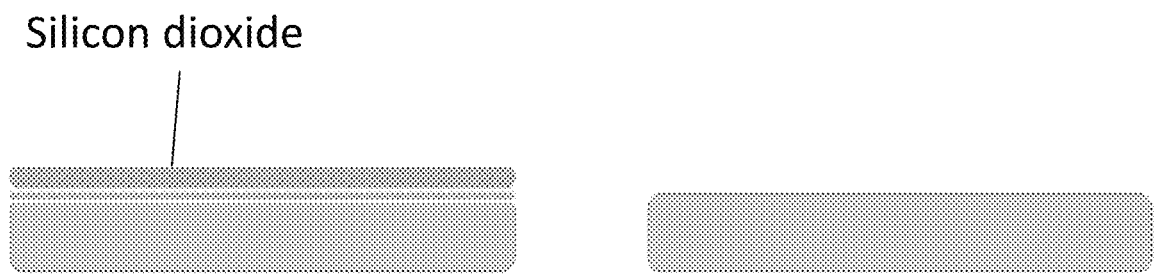
Figure 6D:
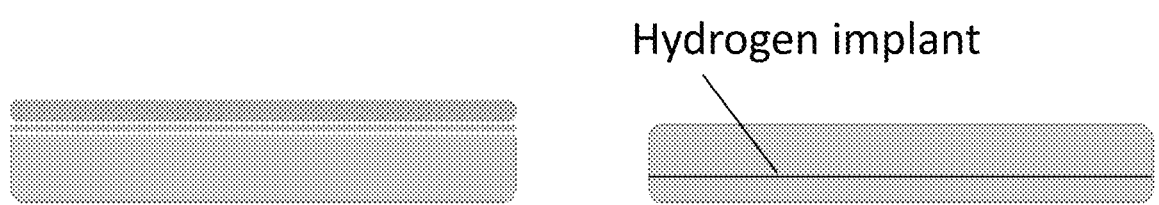
FIG. 6D shows an intermediate product at a fourth stage of the exemplary method of FIG. 5.
Figure 6E:
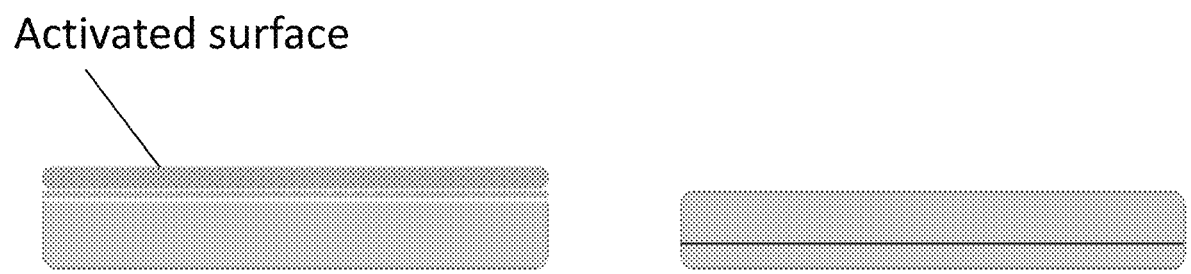
FIG. 6E shows an intermediate product at a fifth stage of the exemplary method of FIG. 5.
Figure 6F:
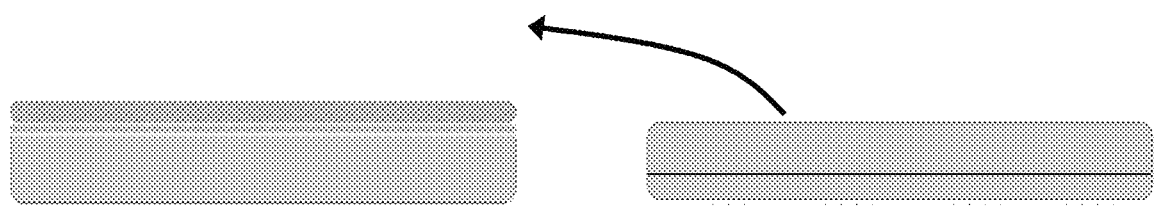
FIG. 6F shows an intermediate product at a sixth stage of the exemplary method of FIG. 5.
Figure 6G:
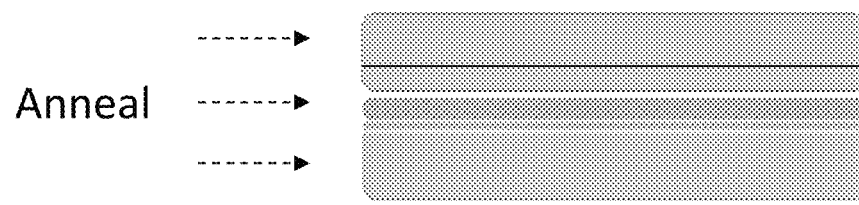
FIG. 6G shows an intermediate product at a seventh stage of the exemplary method of FIG. 5.
Figure 6H:
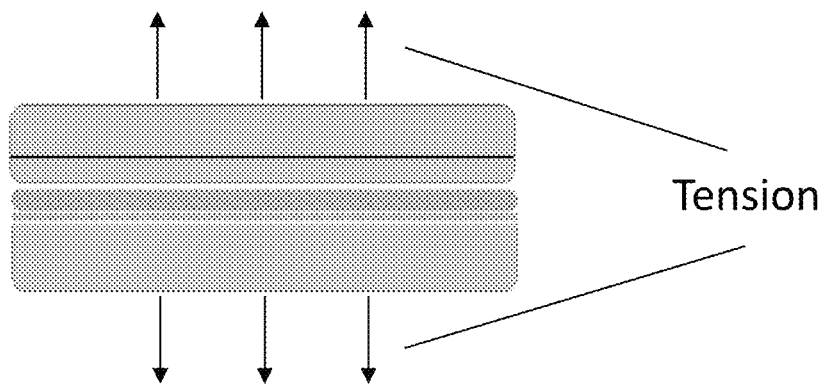
FIG. 6H shows an intermediate product at an eighth stage of the exemplary method of FIG. 5.
Figure 6I:
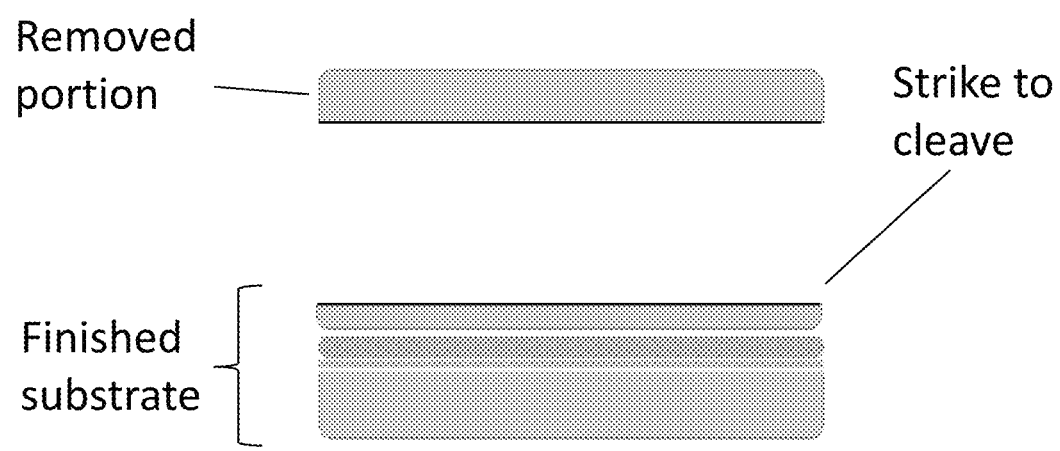
FIG. 6I shows a finished product following a ninth stage of the exemplary method of FIG. 5.

FIG. 5 shows a flowchart of an exemplary method 500 for producing the device 400. FIGS. 6A-6H show various intermediate products that exist during performance of the exemplary method 500 and FIG. 6I shows the final product of the performance of the exemplary method 500. In step 510, first and second silicon wafers are provided. In some embodiments, the thickness of each of the first and second silicon wafers is in the range of 500-700 microns. In some embodiments, the first silicon wafer is referred to herein as a handle wafer. As described above with reference to FIG. 4, in some embodiments, the handle wafer comprises high-resistivity silicon. FIG. 6A shows a schematic view of the first and second silicon wafers provided in step 510.

In step 520, an arsenic layer is diffused into the handle wafer provided in step 510. In some embodiments, the arsenic layer is applied by spin-coating a liquid colloidal solution including arsenic onto the handle wafer and subsequently allowing the arsenic to diffuse into the handle wafer. In some embodiments, the liquid colloidal solution includes arsenic-doped glass. In some embodiments, the liquid colloidal solution is the solution commercialized under the trade name As-0200 by Desert Silicon, Inc. of Tempe, Ariz. In some embodiments, the diffusion occurs for a controlled period of time and at a controlled temperature to produce a layer of diffused arsenic having a desired depth. In some embodiments, when a dopant (e.g., arsenic) is being diffused into a silicon crystal (e.g., the handle wafer provided in step 510), the silicon crystal consists of a solid lattice of atoms through which the dopant has to move. The dopant can continue to diffuse as long as either a concentration gradient is balanced, or until the temperature is lowered such that atoms of the dopant can no longer move. Consequently, a longer period of time during which diffusion is allowed to occur will result in a layer of diffused arsenic having a greater depth, and a higher controlled temperature during the diffusion process will result in a layer of diffused arsenic having a greater depth.

In some embodiments, the diffusion process of step 520 is performed using a configured temperature. In some embodiments, the temperature is between 700 degrees Celsius and 1200 degrees Celsius. In some embodiments, the temperature is between 800 degrees Celsius and 1200 degrees Celsius. In some embodiments, the temperature is between 900 degrees Celsius and 1200 degrees Celsius. In some embodiments, the temperature is between 1000 degrees Celsius and 1200 degrees Celsius. In some embodiments, the temperature is between 1100 degrees Celsius and 1200 degrees Celsius. In some embodiments, the temperature is between 700 degrees Celsius and 1100 degrees Celsius. In some embodiments, the temperature is between 800 degrees Celsius and 1100 degrees Celsius. In some embodiments, the temperature is between 900 degrees Celsius and 1100 degrees Celsius. In some embodiments, the temperature is between 1000 degrees Celsius and 1100 degrees Celsius. In some embodiments, the temperature is between 700 degrees Celsius and 1000 degrees Celsius. In some embodiments, the temperature is between 800 degrees Celsius and 1000 degrees Celsius. In some embodiments, the temperature is between 900 degrees Celsius and 1000 degrees Celsius. In some embodiments, the temperature is between 700 degrees Celsius and 900 degrees Celsius. In some embodiments, the temperature is between 800 degrees Celsius and 900 degrees Celsius. In some embodiments, the temperature is between 700 degrees Celsius and 800 degrees Celsius. In some embodiments, as discussed above, an increased temperature will result in an increased depth of the diffused arsenic layer, while a decreased temperature will result in a decreased depth of the diffused arsenic layer. Consequently, in some embodiments, the temperature used during the diffusion process of step 520 can be tuned to adjust the depth of the trap-rich layer, thereby adjusting properties that depend on the depth of the trap-rich layer (e.g., charge dissipation and device frequency, as discussed above).

Figure 7A:
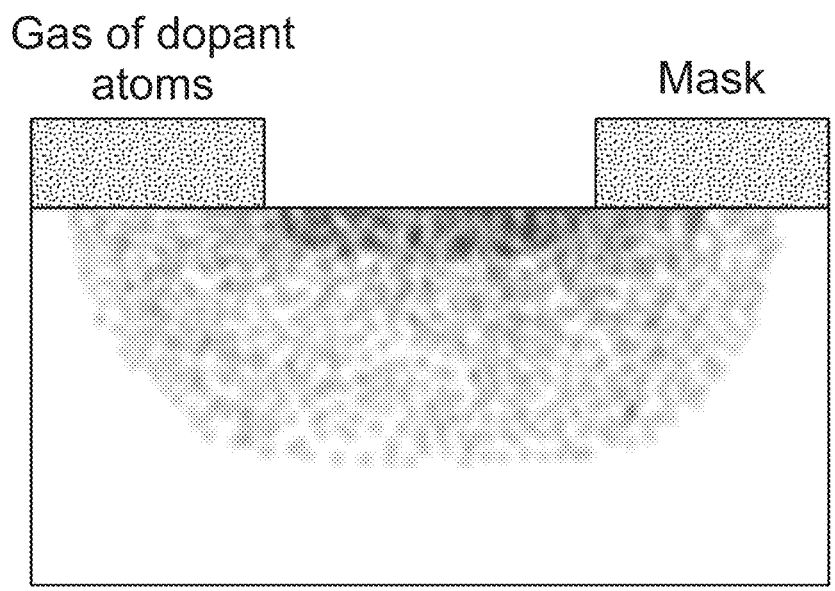
FIG. 7A shows a rendering of the concentration of arsenic within an exemplary first silicon wafer having arsenic diffused therein.
Figure 7B:
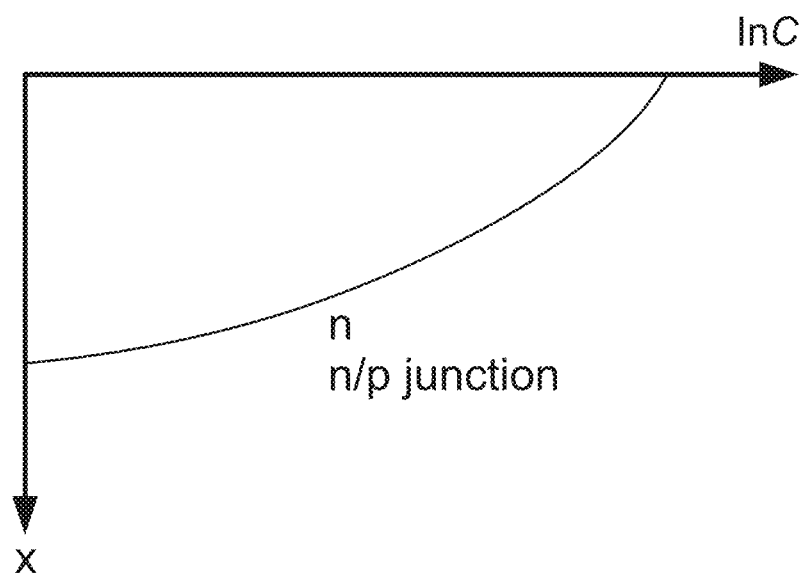
FIG. 7B shows a plot of arsenic concentration against depth for the exemplary first silicon wafer represented by FIG. 7A.

In some embodiments, the diffusion process of step 520 is performed by allowing the arsenic to diffuse for a configured period of time. In some embodiments, the period of time is between 5 hours and 20 hours. In some embodiments, the period of time is between 8 hours and 20 hours. In some embodiments, the period of time is between 11 hours and 20 hours. In some embodiments, the period of time is between 14 hours and 20 hours. In some embodiments, the period of time is between 17 hours and 20 hours. In some embodiments, the period of time is between 5 hours and 17 hours. In some embodiments, the period of time is between 8 hours and 17 hours. In some embodiments, the period of time is between 11 hours and 17 hours. In some embodiments, the period of time is between 14 hours and 17 hours. In some embodiments, the period of time is between 5 hours and 14 hours. In some embodiments, the period of time is between 8 hours and 14 hours. In some embodiments, the period of time is between 11 hours and 14 hours. In some embodiments, the period of time is between 5 hours and 11 hours. In some embodiments, the period of time is between 8 hours and 11 hours. In some embodiments, the period of time is between 5 hours and 8 hours. In some embodiments, as discussed above, an increased duration of the time period during which diffusion occurs will result in an increased depth of the diffused arsenic layer, while a decreased time period during which diffusion occurs will result in a decreased depth of the diffused arsenic layer. Consequently, in some embodiments, the duration of time during which diffusion occurs during the diffusion process of step 520 can be tuned to adjust the depth of the trap-rich layer, thereby adjusting properties that depend on the depth of the trap-rich layer (e.g., charge dissipation and device frequency, as discussed above). FIG. 6B shows a schematic view of the first silicon wafer with the arsenic layer diffused therein and the second silicon wafer after the performance of step 520. FIG. 7A shows an exemplary rendering of the concentration of arsenic within the first silicon wafer after the performance of step 520. FIG. 7B shows a graph of arsenic concentration against depth for the exemplary rendering of FIG. 7A. It may be seen from FIGS. 7A and 7B that the arsenic penetrates to a depth within the first silicon wafer (e.g., to a depth that is between 1 micron and 10 microns, as discussed above), and that the concentration of arsenic is greatest at the surface of the first silicon wafer and decreases below the surface.

Figure 7C:
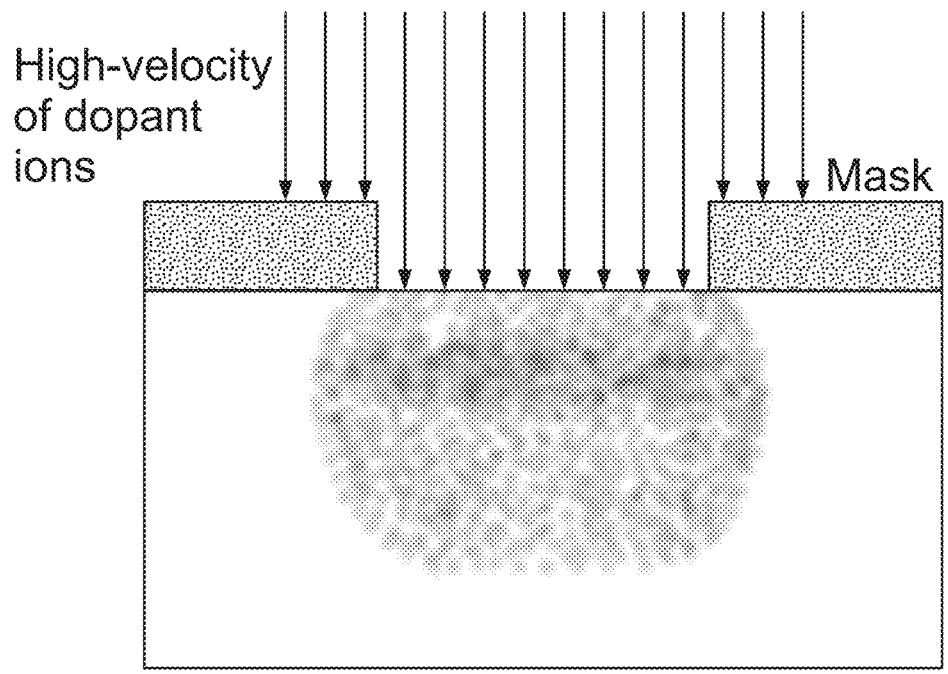
FIG. 7C shows a rendering of the concentration of arsenic within an exemplary first silicon wafer having arsenic implanted therein by ion implantation.
Figure 7D:
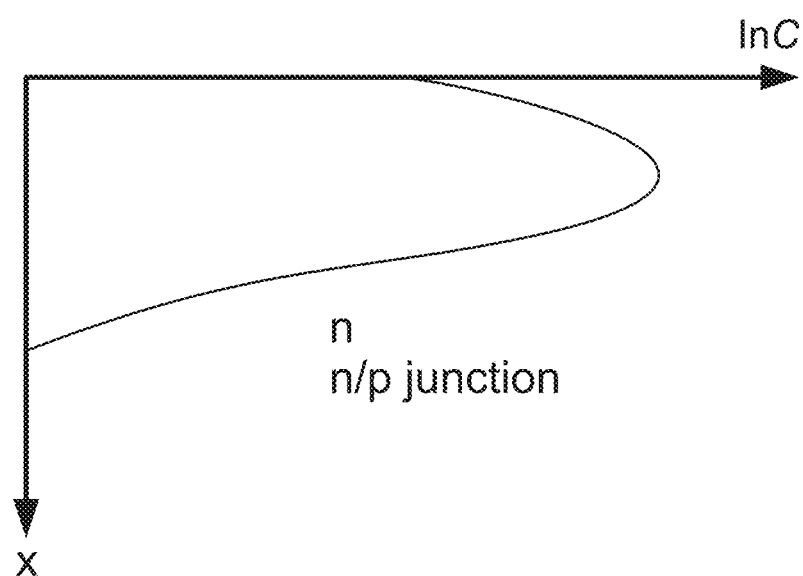
FIG. 7D shows a plot of arsenic concentration against depth for the exemplary first silicon wafer represented by FIG. 7C.

In some embodiments, rather than applying the arsenic by coating the arsenic onto the silicon wafer and allowing the arsenic to diffuse into the silicon wafer, the arsenic is applied to the silicon wafer by ion implantation. In some embodiments, an ion implantation process includes projecting a beam of high-energy arsenic ions at the handle wafer provided in step 510. In some embodiments, projection of such a beam causes the arsenic to penetrate and remain within the handle wafer. In some embodiments, the collisions between the arsenic ions and the atoms of the silicon lattice during such a process causes distortion and weakening of the crystal structure of the silicon. In some embodiments, to address such distortion, an annealing step is performed following projection of the beam of high-energy arsenic ions. FIG. 7C shows an exemplary rendering of the concentration of arsenic within the first silicon wafer after application by ion implantation. FIG. 7D shows a graph of arsenic concentration against depth for the exemplary rendering of FIG. 7C. It may be seen from FIGS. 7C and 7D that the arsenic penetrates to a depth within the first silicon wafer (e.g., to a depth that is between 1 micron and 10 microns, as discussed above), and that the concentration of arsenic is greatest slightly below the surface, decreasing both toward the surface and further below the surface.

Continuing to refer to FIG. 5, in step 530, a silicon dioxide layer is deposited on the handle wafer so as to overlay the arsenic layer diffused into the handle wafer in step 520. In some embodiments, the silicon dioxide layer is deposited through the use of an HDPCVD process. In some embodiments, the HDPCVD process of step 530 is performed using an inductively-coupled plasma ("ICP") source. In some embodiments, the HDPCVD process of step 530 is performed by introducing a mix of a plurality of gas flows to the handle wafer with the arsenic layer diffused therein. In some embodiments, the gas mixture includes a flow of oxygen gas (e.g., $O_2$), a flow of silane (e.g., $SiH_4$), and a flow of argon (e.g., Ar). FIG. 6C shows a schematic view of the first silicon wafer with the arsenic layer diffused therein and the silicon dioxide layer deposited thereon and the second silicon wafer after the performance of step 530.

In some embodiments, the HDPCVD process of step 530 is performed using a configured pressure. In some embodiments, the pressure is between 5 millitorr and 20 millitorr. In some embodiments, the pressure is between 5 millitorr and 10 millitorr. In some embodiments, the pressure is between 10 millitorr and 15 millitorr. In some embodiments, the pressure is between 15 millitorr and 20 millitorr. In some embodiments, the pressure is between 5 millitorr and 15 millitorr. In some embodiments, the pressure is between 10 millitorr and 20 millitorr. In some embodiments, varying the pressure may result in varying degrees of film uniformity. For example, in some embodiments, a pressure of 12 millitorr produces a generally uniform film with about 1% non-uniformity and a slight bias toward the center of the wafer. In some embodiments, varying the pressure will change the center-to-edge rates and may therefore enable the uniformity to be adjusted. In some embodiments, changes in the pressure result in corresponding changes to a Debye sphere, which is a sphere of influence, and outside of which charges are screened. In some embodiments, an increase in the pressure used during the HDPCVD process of step 530 produces a larger Debye sphere, which results in an increase in the deposition rate at the edges as compared to the center. Conversely, in some embodiments, a decrease in the pressure used during the HDPCVD process of step 530 produces a smaller Debye sphere, which results in a decrease in the deposition rate at the edges as compared to the center. Consequently, in some embodiments, the pressure used during the HDPCVD process of step 530 can be tuned to adjust the uniformity of the deposited film.

In some embodiments, the HDPCVD process of step 530 is performed using an ICP source operating at a configured ICP power. In some embodiments, the ICP power is between 65 watts and 225 watts. In some embodiments, the ICP power is between 65 watts and 105 watts. In some embodiments, the ICP power is between 105 watts and 145 watts. In some embodiments, the ICP power is between 145 watts and 185 watts. In some embodiments, the ICP power is between 185 watts and 225 watts. In some embodiments, the ICP power is between 65 watts and 145 watts. In some embodiments, the ICP power is between 105 watts and 185 watts. In some embodiments, the ICP power is between 145 watts and 225 watts. In some embodiments, the ICP power is between 65 watts and 185 watts. In some embodiments, the ICP power is between 145 watts and 225 watts. In some embodiments, varying the ICP power results in varying degrees of film uniformity. In some embodiments, changes in the ICP power result in corresponding changes to a Debye sphere, which is a sphere of influence, and outside of which charges are screened. In some embodiments, an increase in the ICP power used during the HDPCVD process of step 530 produces a smaller Debye sphere, which results in a decrease in the deposition rate at the edges as compared to the center. Conversely, in some embodiments, a decrease in the ICP power used during the HDPCVD process of step 530 produces a larger Debye sphere, which results in an increase in the deposition rate at the edges as compared to the center. Consequently, in some embodiments, the ICP power used during the HDPCVD process of step 530 can be tuned to adjust the uniformity of the deposited film.

In some embodiments, the HDPCVD process of step 530 is performed using a configured bias power. In some embodiments, the bias power is between 0 and 100 watts. In some embodiments, the bias power is between 0 watts and 25 watts. In some embodiments, the bias power is between 25 watts and 50 watts. In some embodiments, the bias power is between 50 watts and 75 watts. In some embodiments, the bias power is between 75 watts and 100 watts. In some embodiments, the bias power is between 0 watts and 50 watts. In some embodiments, the bias power is between 25 watts and 75 watts. In some embodiments, the bias power is between 50 watts and 100 watts. In some embodiments, the bias power is between 0 watts and 75 watts. In some embodiments, the bias power is between 25 watts and 100 watts. In some embodiments, varying the bias power results in varying the density of the film. In some embodiments, varying the bias power results in varying the percentage of hydrogen in the deposited film, thereby varying the density of the deposited film. In some embodiments, a film that has a lower hydrogen content will be denser and a film that has a higher hydrogen content will be less dense. In some embodiments, an increase in bias power increases the speed of hydrogen in the plasma state, thereby producing a film that has a lower hydrogen content. In some embodiments, conversely, a decrease in bias power decreases the speed of hydrogen in the plasma state, thereby producing a film that has a higher hydrogen content. In some embodiments, varying the bias power results in varying the film uniformity. In some embodiments, increasing the bias power increases the electrode field generated from the lower electrode, thereby increasing the uniformity of the film. In some embodiments, conversely, decreasing the bias power decreases the electrode field generated from the lower electrode, thereby decreasing the uniformity of the film.

In some embodiments, the HDPCVD process of step 530 is performed with the handle wafer held at a configured temperature. In some embodiments, the temperature is between 100 and 250 degrees Celsius. In some embodiments, the temperature is between 100 and 150 degrees Celsius. In some embodiments, the temperature is between 150 and 200 degrees Celsius. In some embodiments, the temperature is between 200 and 250 degrees Celsius. In some embodiments, the temperature is between 100 and 200 degrees Celsius. In some embodiments, the temperature is between 150 and 250 degrees Celsius. In some embodiments, varying the handle wafer temperature results in varying the percentage of hydrogen in the deposited film, thereby varying the density of the deposited film. In some embodiments, a film that has a lower hydrogen content will be denser and a film that has a higher hydrogen content will be less dense. In some embodiments, increasing the temperature of the handle wafer decreases the hydrogen content of the film. In some embodiments, conversely, decreasing the temperature of the handle wafer increases the hydrogen content of the film. In some embodiments, varying the handle wafer temperature results in varying the deposition rate of the film. In some embodiments, increasing the temperature of the handle wafer decreases the RF energy needed to break down the silane gas into silicon and hydrogen and increases the time of recombination, thereby increasing the deposition rate. In some embodiments, conversely, decreasing the temperature of the handle wafer increases the RF energy needed to break down the silane gas into silicon and hydrogen and decreases the time of recombination, thereby decreasing the deposition rate.

In some embodiments, the HDPCVD process of step 530 is performed with the flow rate of $O_2$ gas at a configured flow rate. In some embodiments, the flow rate of $O_2$ gas is in a range of between 20 and 35 sccm. In some embodiments, the flow rate of $O_2$ gas is a range of between 20 and 25 sccm. In some embodiments, the flow rate of $O_2$ gas is a range of between 25 and 30 sccm. In some embodiments, the flow rate of $O_2$ gas is a range of between 30 and 35 sccm. In some embodiments, the flow rate of $O_2$ gas is a range of between 20 and 30 sccm. In some embodiments, the flow rate of $O_2$ gas is a range of between 25 and 35 sccm.

In some embodiments, the HDPCVD process of step 530 is performed with the flow rate of silane gas at a configured flow rate. In some embodiments, the flow rate of silane gas is in a range of between 20 and 35 sccm. In some embodiments, the flow rate of silane gas is a range of between 20 and 25 sccm. In some embodiments, the flow rate of silane gas is a range of between 25 and 30 sccm. In some embodiments, the flow rate of silane gas is a range of between 30 and 35 sccm. In some embodiments, the flow rate of silane gas is a range of between 20 and 30 sccm. In some embodiments, the flow rate of silane gas is a range of between 25 and 35 sccm.

In some embodiments, the HDPCVD process of step 530 is performed with the flow rate of argon gas at a configured flow rate. In some embodiments, the flow rate of argon gas is in a range of between 20 and 35 sccm. In some embodiments, the flow rate of argon gas is a range of between 20 and 25 sccm. In some embodiments, the flow rate of argon gas is a range of between 25 and 30 sccm. In some embodiments, the flow rate of argon gas is a range of between 30 and 35 sccm. In some embodiments, the flow rate of argon gas is a range of between 20 and 30 sccm. In some embodiments, the flow rate of argon gas is a range of between 25 and 35 sccm.

In some embodiments, the parameters of the HDPCVD process of step 530 are configured so as to provide a controlled deposition rate of the silicon dioxide layer on the handle wafer. In some embodiments, the deposition rate of the silicon dioxide layer is between 900 and 1100 angstroms per minute. In some embodiments, the deposition rate of the silicon dioxide layer is between 950 and 1050 angstroms per minute. In some embodiments, the deposition rate of the silicon dioxide layer is between 975 and 1025 angstroms per minute. In some embodiments, the deposition rate of the silicon dioxide layer is about 1000 angstroms per minute. In some embodiments, the deposition rate of the silicon dioxide layer is 1000 angstroms per minute.

In some embodiments, the parameters of the HDPCVD process of step 530 are configured so as to provide a controlled thickness of the silicon dioxide layer on the handle wafer. In some embodiments, the thickness of the silicon dioxide layer is between 1500 and 5000 angstroms. In some embodiments, the thickness of the silicon dioxide layer is between 1500 and 2000 angstroms. In some embodiments, the thickness of the silicon dioxide layer is between 2000 and 2500 angstroms. In some embodiments, the thickness of the silicon dioxide layer is between 2500 and 3000 angstroms. In some embodiments, the thickness of the silicon dioxide layer is between 3000 and 3500 angstroms. In some embodiments, the thickness of the silicon dioxide layer is between 3500 and 4000 angstroms. In some embodiments, the thickness of the silicon dioxide layer is between 4000 and 4500 angstroms. In some embodiments, the thickness of the silicon dioxide layer is between 4500 and 5000 angstroms. In some embodiments, the thickness of the silicon dioxide layer is between 1500 and 2500 angstroms. In some embodiments, the thickness of the silicon dioxide layer is between 2000 and 3000 angstroms. In some embodiments, the thickness of the silicon dioxide layer is between 2500 and 3500 angstroms. In some embodiments, the thickness of the silicon dioxide layer is between 3000 and 4000 angstroms. In some embodiments, the thickness of the silicon dioxide layer is between 3500 and 4500 angstroms. In some embodiments, the thickness of the silicon dioxide layer is between 4000 and 5000 angstroms. In some embodiments, the thickness of the silicon dioxide layer is between 1500 and 3000 angstroms. In some embodiments, the thickness of the silicon dioxide layer is between 2000 and 3500 angstroms. In some embodiments, the thickness of the silicon dioxide layer is between 2500 and 4000 angstroms. In some embodiments, the thickness of the silicon dioxide layer is between 3000 and 4500 angstroms. In some embodiments, the thickness of the silicon dioxide layer is between 3500 and 5000 angstroms. In some embodiments, the thickness of the silicon dioxide layer is between 1500 and 3500 angstroms. In some embodiments, the thickness of the silicon dioxide layer is between 2000 and 4000 angstroms. In some embodiments, the thickness of the silicon dioxide layer is between 2500 and 4500 angstroms. In some embodiments, the thickness of the silicon dioxide layer is between 3000 and 5000 angstroms. In some embodiments, the thickness of the silicon dioxide layer is between 1500 and 4000 angstroms. In some embodiments, the thickness of the silicon dioxide layer is between 2000 and 4500 angstroms. In some embodiments, the thickness of the silicon dioxide layer is between 2500 and 5000 angstroms. In some embodiments, the thickness of the silicon dioxide layer is between 1500 and 4500 angstroms. In some embodiments, the thickness of the silicon dioxide layer is between 2000 and 5000 angstroms. In some embodiments, the HDPCVD process of step 530 is performed for a duration of between two and three minutes so as to achieve the controlled thickness of the silicon dioxide layer.

Continuing to refer to FIG. 5, in step 540, a hydrogen implant is implanted in the second wafer. In some embodiments, the hydrogen implant is positioned so as to define a cleave plane in the second wafer. In some embodiments, the cleave plane defines a desired thickness of the second silicon wafer following the completion of the method 500. In some embodiments, the hydrogen implant is implanted using an ion implanter. In some embodiments, the ion implanter is an ion implanter such as those commercialized by Nissin Ion Equipment Co. Ltd. of Kyoto, Japan. In some embodiments, the ion implanter is configured to emit a beam of hydrogen ions. In some embodiments, the ion implanter is configured to operate at a power of between 5000 volts and 1 megavolt. In some embodiments, the desired thickness is in the range of 500-5000 angstroms. In some embodiments, the desired thickness is in the range of 500-2000 angstroms. In some embodiments, the desired thickness is in the range of 2000-3500 angstroms. In some embodiments, the desired thickness is in the range of 3500-5000 angstroms. In some embodiments, the desired thickness is in the range of 500-3500 angstroms. In some embodiments, the desired thickness is in the range of 2000-5000 angstroms. In some embodiments, implanted hydrogen generates displacement damage in the form of interstitials, vacancies, and complexes. In some embodiments, such defects generate areas with a high number of broken bonds called platelets. In some embodiments, hydrogen is trapped at these surfaces, passivating the broken bonds. FIG. 6D shows a schematic view of the first silicon wafer with the arsenic layer diffused therein and the silicon dioxide layer deposited thereon and the second silicon wafer with the hydrogen implant implanted therein after the performance of step 540.

Continuing to refer to FIG. 5, in step 550, the surface of the silicon dioxide layer that was deposited in step 530 is activated. In some embodiments, the activation is plasma activation that is performed by bombarding the surface of the silicon dioxide layer with short-lived chemical species produced within the plasma volume to initiate chemical reactions at the surface and enable adhesion. In some embodiments, the activation is low-pressure plasma-activated bonding at a pressure in a range of between 0.1 and 100 Pa. FIG. 6E shows a schematic view of the first silicon wafer with the arsenic layer diffused therein and the activated silicon dioxide layer deposited thereon and the second silicon wafer with the hydrogen implant implanted therein after the performance of step 550.

Continuing to refer to FIG. 5, in step 560, the first silicon wafer (i.e., having an arsenic layer diffused therein and a silicon dioxide layer deposited thereon) is brought together with the second silicon wafer (i.e., having a hydrogen implant therein) such that the activated surface of the silicon dioxide layer faces the second silicon wafer, and with the second silicon wafer oriented such that, after cleavage along the cleave plane defined by the hydrogen implant, the desired portion of the second silicon wafer (i.e., the portion having a thickness as discussed above) will remain adjacent to the first silicon wafer. FIG. 6F shows a schematic view of the joining of the first silicon wafer with the arsenic layer diffused therein and the activated silicon dioxide layer deposited thereon to the second silicon wafer with the hydrogen implant implanted therein in accordance with the performance of step 560.

Continuing to refer to FIG. 5, in step 570, the joined first and second silicon wafers are subjected to a low temperature annealing process. In some embodiments, the temperature used in the annealing process is in the range of 200 to 400 degrees Celsius. In some embodiments, a temperature used in the annealing process is in the range of 200 to 250 degrees Celsius. In some embodiments, a temperature used in the annealing process is in the range of 250 to 300 degrees Celsius. In some embodiments, a temperature used in the annealing process is in the range of 300 to 350 degrees Celsius. In some embodiments, a temperature used in the annealing process is in the range of 350 to 400 degrees Celsius. In some embodiments, a temperature used in the annealing process is in the range of 200 to 300 degrees Celsius. In some embodiments, a temperature used in the annealing process is in the range of 250 to 350 degrees Celsius. In some embodiments, a temperature used in the annealing process is in the range of 300 to 400 degrees Celsius. In some embodiments, a temperature used in the annealing process is in the range of 200 to 350 degrees Celsius. In some embodiments, a temperature used in the annealing process is in the range of 250 to 400 degrees Celsius. In some embodiments, a duration of the annealing process is between one hour and eight hours. In some embodiments, during the annealing process, the trapped hydrogen discussed above with reference to step 540 dissociates from complexes and diffuses into the platelets, forming $H_2$ molecules. In some embodiments, due to the pressure increase, the platelets expand into micro cracks which join together in the same plane, causing material exfoliation. FIG. 6G shows a schematic illustration of the annealing process of step 570.

Continuing to refer to FIG. 5, in step 580, the joined first and second silicon wafers are placed under tension (i.e., are tensioned so as to force the first and second silicon wafers away from one another. In some embodiments, the tensioning is at a force sufficient to produce a tension that is in the range of 10 to 60 pounds per square inch across the joined area. FIG. 6H shows a schematic illustration of the tensioning process of step 580.

Continuing to refer to FIG. 5, in step 590, the second silicon wafer is struck at the cleave plane defined by the hydrogen implant. In some embodiments, the second silicon wafer is struck using a thin blade-like element using an applied force that is in the range of 5-10 pounds per square inch across the target area to initiate a debond wave. In some embodiments, the thin blade-like element is any suitable object having a suitable width. In some embodiments, the suitable width is about 50 microns. As a result of this strike, the portion of the second silicon wafer (which may be referred to in this context as a "donor wafer") that is positioned between the hydrogen implant and the first silicon wafer remains attached to the first silicon wafer (which may be referred to in this context as a "handle wafer"), while the remaining portion of the second silicon wafer is cleaved therefrom. Following this cleaving step, the finished wafer has been produced. FIG. 6I shows a schematic illustration of the finished wafer and the removed portion of the second silicon wafer following the performance of step 590.

In some embodiments, an exemplary substrate (e.g., the device 100 described above with reference to FIG. 1, a substrate made in accordance with the method 200 shown in FIG. 2, the device 400 described above with reference to FIG. 4, and/or a substrate made in accordance with the method 500 shown in FIG. 5) includes a "trap-rich" layer (e.g., the silicon nitride layer of the device 100 or the diffused arsenic layer of the device 400) that is disposed within the substrate at a position abutting (in the case of the silicon nitride layer of the device 100) or within (in the case of the arsenic layer of the device 400) the top surface of the handle wafer. In some embodiments, such an exemplary substrate is suitable for use in the fabrication of RF systems. In some embodiments, the trap-rich layer is operative to trap carriers, i.e., parasitic currents that may be induced by RF radiation. In some embodiments, such a substrate is, therefore, suitable for use in the fabrication of RF systems because chip designers can integrate diverse functions (e.g., switches, power amplifiers, antenna tuners, etc.) on the same chip without having currents induced by such functions interfere with one another.

Previous techniques for forming an SOI substrate suitable for use in the fabrication of RF systems include the step of depositing a trap-rich layer on a handle wafer prior to bonding the handle wafer to an active silicon wafer. For example, a layer of polysilicon may be used in such techniques. However, SOI substrates formed using this process suffer from thermal instability because high-temperature front-end-of-line ("FEOL") processes negatively affect the crystalline structure of the polysilicon wafer and its interface with the handle wafer, thereby degrading the trapping properties of the polysilicon layer. In some embodiments, the exemplary embodiments prevent such thermal instability issues. In some embodiments, the exemplary embodiments reduce fabrication costs associated with depositing a trap-rich material such as polysilicon onto a handle wafer.

In some embodiments, a silicon-on-insulator substrate includes a layered structure including, in layered order: (1) a high-resistivity base layer having a first side and a second side opposite the first side, wherein the high-resistivity base layer comprises (a) silicon, and (b) a trap-rich region comprising arsenic diffused within the first side of the high-resistivity base layer, wherein the trap-rich region has (i) a thickness that is in a range of 1 to 10 microns, and (ii) a trap density that is in a range of from $0.8*10^{10}$ cm$^2$ eV$^{-1}$ to $1.2*10^{10}$ cm$^2$ eV$^{-1}$; wherein the high-resistivity base layer has a resistivity in a range of from 50 to 100 ohm-meters; (2) a silicon dioxide layer positioned on the first side of the high-resistivity base layer, and (3) a transfer layer positioned on the silicon dioxide layer.

In some embodiments, a method includes providing a first silicon wafer having a first side and a second side; applying a sufficient amount of arsenic to the first side of the first silicon wafer to result in the arsenic diffused into the first side of the first silicon wafer to produce a trap-rich region, wherein a thickness of the trap-rich region is in a range of from 1 to 10 microns, and wherein the trap-rich region has a trap density that is in a range of from $0.8*10^{10}$ cm$^2$ eV$^{-1}$ to $1.2*10^{10}$ cm$^2$ eV$^{-1}$; depositing a silicon dioxide layer on the first side of the first silicon wafer using a high density plasma chemical vapor deposition (HDPCVD) process, wherein the HDPCVD process uses a flow of oxygen gas, a flow of silane gas, and a flow of argon gas; providing a second silicon wafer having a first side and a second side opposite the first side of the second silicon wafer; introducing a hydrogen implant into the second silicon wafer so as to define a cleave plane; activating the silicon dioxide layer; contacting the first side of the second silicon wafer to the activated silicon dioxide layer, thereby producing a combined wafer; annealing the combined wafer; applying a tension to the combined wafer in a direction so as to urge the first silicon wafer and the second silicon wafer apart from one another; and cleaving the second silicon wafer at the cleave plane, thereby producing a silicon-on-insulator substrate.

In some embodiments, a method includes providing a first silicon wafer having a first side and a second side; depositing a silicon nitride layer on the first side of the silicon wafer using a first high density plasma chemical vapor deposition (HDPCVD) process, wherein the first HDPCVD process uses an inductively-coupled plasma source, wherein the inductively-coupled plasma source is operated at a power that is in a range of from 65 watts to 225 watts during the first HDPCVD process, wherein the first HDPCVD process uses a flow of oxygen gas, a flow of silane gas, and a flow of argon gas, wherein a flow rate of the flow of nitrogen gas during the first HDPCVD process is in a range of from 20 to 35 sccm, wherein a flow rate of the flow of silane gas is in a range of 20 to 35 sccm, wherein a flow rate of the flow of argon gas in a range of from 20 to 35 sccm, wherein the first HDPCVD process is performed at a pressure that is in a range of from 5 millitorr to 20 millitorr, wherein the first HDPCVD process is performed using a bias power that is in a range of from 0 to 100 watts, wherein the first HDPCVD process is performed with the first silicon wafer held at a temperature that is in a range of from 100 to 250 degrees Celsius, wherein a deposition rate of the silicon nitride layer is in a range of from 300 to 500 angstroms per minute, wherein a thickness of the silicon nitride layer is in a range of from 300 to 500 angstroms, and wherein the silicon nitride is a trap-rich layer having a trap density that is in a range of $0.8*10^{10}$ cm$^2$ eV$^{-1}$ to $1.2*10^{10}$ cm$^2$ eV$^{-1}$; depositing a silicon dioxide layer on the silicon nitride layer using a second HDPCVD process, wherein the second HDPCVD process uses an inductively-coupled plasma source, wherein the inductively-coupled plasma source is operated at a power that is in a range of from 65 watts to 225 watts during the second HDPCVD process, wherein the second HDPCVD process uses a flow of oxygen gas, a flow of silane gas, and a flow of argon gas, wherein a flow rate of the flow of oxygen gas during the second HDPCVD process is in a range of from 20 to 35 sccm, wherein a flow rate of the flow of silane gas during the second HDPCVD process is in a range of 20 to 35 sccm, wherein a flow rate of the flow of argon gas during the second HDPCVD process in a range of from 20 to 35 sccm, wherein the second HDPCVD process is performed at a pressure that is in a range of from 5 millitorr to 20 millitorr, wherein the second HDPCVD process is performed using a bias power that is in a range of from 0 to 100 watts, wherein the second HDPCVD process is performed with the first silicon wafer held at a temperature that is in a range of from 100 to 250 degrees Celsius, wherein a deposition rate of the silicon dioxide layer is in a range of from 900 to 1100 angstroms per minute, and wherein a thickness of the silicon dioxide layer is in a range of from 1500 to 5000 angstroms; providing a second silicon wafer having a first side and a second side opposite the first side of the second silicon wafer; introducing a hydrogen implant into the second silicon wafer so as to define a cleave plane, wherein a thickness of a portion of the second silicon wafer between the first side of the second silicon wafer and the cleave plane is in a range of from 500 to 5000 angstroms; activating the silicon dioxide layer, wherein the activating step comprises low-pressure plasma-activated bonding at a pressure in a range of from 0.1 to 100 Pa; contacting the first side of the second silicon wafer to the activated silicon dioxide layer, thereby producing a combined wafer; annealing the combined wafer, wherein the annealing is performed at a temperature in a range of from 200 to 400 degrees Celsius for a duration in a range of from one hour to eight hours; applying a tension to the combined wafer in a direction so as to urge the first silicon wafer and the second silicon wafer apart from one another; and striking an edge of the second silicon wafer so as to cleave the second silicon wafer at the cleave plane, thereby producing a silicon-on-insulator substrate.

All art-known functional equivalents, of any such materials and methods are intended to be included in this invention. The terms and expressions which have been employed herein are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this disclosure.

While a number of embodiments of the present invention have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

What is claimed is:

1. A silicon-on-insulator substrate, comprising:
  a layered structure including, in layered order:
    (1) a high-resistivity base layer having a first side and a second side opposite the first side,
      wherein the high-resistivity base layer comprises
        (a) silicon, and
        (b) a trap-rich region comprising arsenic diffused within the entire first side of the high-resistivity base layer, wherein the trap-rich region has
          (i) a thickness that is in a range of 1 to 10 microns, and
          (ii) a trap density that is in a range of $0.8*10^{10}$ cm$^2$ eV$^{-1}$ to $1.2*10^{10}$ cm$^2$ eV$^{-1}$,
      wherein the high-resistivity base layer has
        (a) a resistivity in a range of from 50 to 100 ohm-meters, and
        (b) a thickness in a range of from 500 to 700 microns;
    (2) a silicon dioxide layer positioned on the first side of the high-resistivity base layer,
      wherein the silicon dioxide layer has a thickness that is in a range of from 1000 to 5000 angstroms; and
    (3) a transfer layer positioned on the silicon dioxide layer,
      wherein the transfer layer comprises a silicon wafer, and
      wherein the transfer layer has a thickness that is a range of from 500 to 5000 angstroms.

2. The silicon-on-insulator substrate of claim 1, wherein the trap-rich region has a trap density that is in a range of $10^{10}$ cm$^2$ eV$^{-1}$ to $1.2*10^{10}$ cm$^2$ eV$^{-1}$.

3. The silicon-on-insulator substrate of claim 1, wherein the trap-rich region comprises arsenic interspersed within a crystalline structure of the silicon of the high-resistivity base layer.

4. The silicon-on-insulator substrate of claim 1, wherein the trap-rich region has a thickness that is in a range of from 4 microns to 7 microns.

5. The silicon-on-insulator substrate of claim 1, wherein the high-resistivity base layer has a thickness that is in a range of from 550 to 650 microns.

6. The silicon-on-insulator substrate of claim 1, wherein the silicon dioxide layer has a thickness that is in a range of from 2000 to 4000 angstroms.

7. The silicon-on-insulator substrate of claim 1, wherein the transfer layer has a thickness that is in a range of from 2000 to 3500 angstroms.

* * * * *